(12) United States Patent
Lee

(10) Patent No.: US 8,087,304 B2
(45) Date of Patent: Jan. 3, 2012

(54) MAGNETOELASTIC TORQUE SENSOR WITH AMBIENT FIELD REJECTION

(76) Inventor: Seong-Jae Lee, Mount Prospect, IL (US)

( * ) Notice: Subject to any disclaimer, the term of this patent is extended or adjusted under 35 U.S.C. 154(b) by 476 days.

(21) Appl. No.: 12/403,992

(22) Filed: Mar. 13, 2009

(65) Prior Publication Data
US 2009/0230953 A1   Sep. 17, 2009

Related U.S. Application Data

(60) Provisional application No. 61/036,619, filed on Mar. 14, 2008.

(51) Int. Cl.
*G01L 3/14* (2006.01)
*G01L 3/00* (2006.01)
*G01B 7/14* (2006.01)

(52) U.S. Cl. ......... 73/862.333; 73/862.321; 73/862.325; 73/862.331; 324/207.11; 324/207.2; 324/207.13

(58) Field of Classification Search ............. 73/862.321, 73/862.325, 862.331–862.335; 324/244, 324/207.11–207.15, 207.2, 207.21, 207.25
See application file for complete search history.

(56) References Cited

U.S. PATENT DOCUMENTS

| | | | | | |
|---|---|---|---|---|---|
| 4,506,554 | A | * | 3/1985 | Blomkvist et al. | 73/862.335 |
| 4,627,298 | A | * | 12/1986 | Sahashi et al. | 73/862.336 |
| 4,760,745 | A | * | 8/1988 | Garshelis | 73/862.333 |
| 4,773,874 | A | * | 9/1988 | Kopeski, Jr. | 439/369 |
| 4,976,160 | A | * | 12/1990 | Dobler et al. | 73/862.336 |
| 4,989,460 | A | * | 2/1991 | Mizuno et al. | 73/862.335 |
| 5,083,359 | A | * | 1/1992 | Aminder et al. | 29/602.1 |
| 5,351,555 | A | * | 10/1994 | Garshelis | 73/862.335 |
| 5,646,356 | A | * | 7/1997 | Ling et al. | 73/862.335 |
| 5,889,215 | A | * | 3/1999 | Kilmartin et al. | 73/862.335 |
| 6,047,605 | A | * | 4/2000 | Garshelis | 73/862.336 |
| 6,222,363 | B1 | * | 4/2001 | Cripe | 324/253 |
| 6,341,534 | B1 | * | 1/2002 | Dombrowski | 73/862.333 |
| 6,532,832 | B2 | * | 3/2003 | Shahcheraghi et al. | 73/862.333 |
| 6,553,847 | B2 | * | 4/2003 | Garshelis | 73/862.336 |
| 6,581,480 | B1 | * | 6/2003 | May et al. | 73/862.333 |
| 6,826,969 | B1 | * | 12/2004 | May | 73/862.331 |
| 6,904,814 | B2 | * | 6/2005 | May | 73/862.333 |
| 6,910,391 | B1 | * | 6/2005 | May | 73/862.333 |
| 6,997,065 | B2 | | 2/2006 | May | |
| 7,143,656 | B2 | * | 12/2006 | Wan et al. | 73/862.331 |
| 7,302,867 | B2 | * | 12/2007 | May | 73/862.331 |
| 7,493,831 | B2 | * | 2/2009 | Varonis | 73/862.333 |
| 2001/0029792 | A1 | | 10/2001 | Garshelis | |
| 2007/0247224 | A1 | * | 10/2007 | May | 330/63 |
| 2010/0242626 | A1 | * | 9/2010 | Weng | 73/862.333 |
| 2011/0162464 | A1 | * | 7/2011 | Weng | 73/862.333 |

FOREIGN PATENT DOCUMENTS

WO   WO-9825116 A1   6/1998
WO   WO-0058704 A1   10/2000

* cited by examiner

*Primary Examiner* — Lisa Caputo
*Assistant Examiner* — Jonathan Dunlap
(74) *Attorney, Agent, or Firm* — Blank Rome LLP

(57) ABSTRACT

The present invention involves a method and apparatus for canceling the effects of magnetic field noise in a torque sensor by placing three sets of magnetic field sensors around a shaft, the first set of field sensors being placed in the central region of the shaft and the second and third sets of field sensors being placed on the right side and left side of the field sensors placed at the central region, respectively. A torque-induced magnetic field is not cancelled with this arrangement of field sensors but a magnetic near field from a near field source is cancelled.

50 Claims, 22 Drawing Sheets

MAGNETOELASTIC TORQUE SENSOR WITH AMBIENT FIELD REJECTION

CROSS-REFERENCE TO RELATED APPLICATIONS

The present application claims priority under 35 U.S.C. §119(e) to U.S. Provisional Patent Application No. 61/036,619, entitled "MAGNETOELASTIC TORQUE SENSOR WITH AMBIENT FIELD REJECTION", filed on Mar. 14, 2008, the entire disclosure of which is incorporated herein by reference.

BACKGROUND OF THE INVENTION

1. Field of the Invention

The invention is related in general to systems and methods involving the use of magnetic field sensors, and in particular the invention is related to systems, methods, and apparatus involving sensors and circuits that cancel magnetic field noise while measuring torque-induced magnetic fields.

2. Description of the Related Art

U.S. Pat. No. 5,351,555, the disclosure of which is incorporated herein by reference in its entirety, discloses a single circularly magnetized region in which the magnetic dipoles tilt in the presence of torsional stress, thereby emanating an externally measurable magnetic field. Because magnetic fields, in the context of their measurement, are fungible, the sensor taught in the '555 patent may be susceptible to other magnetic fields of exterior origin. In particular, the Earth's magnetic field will cause a phenomenon known as "compassing," in which the measured field is the sum of the torque dependant field plus the Earth's north-south magnetic field component. Within the context of this disclosure, the term "compassing" shall be used to describe any error resulting from interaction between the magnetic field sensors and magnetic fields of external origin.

U.S. Pat. No. 5,520,059, the disclosure of which is also incorporated herein by reference in its entirety, addresses the compassing issue with the addition of an adjacent second region that is magnetized in the opposite circular direction to the first region. This arrangement yields two torque-dependent magnetic fields and, because the acquiescent magnetization of the regions is in opposite directions, the torque-dependent magnetic fields are of equal but opposite magnetic polarity. Corresponding with the two regions described in the '059 patent are two magnetic field sensors, each with an opposite axial polarity to the other (but with the same polarity relative to each of the corresponding magnetized regions). Thus, an ambient magnetic far field affects each of the field sensors in an equal but opposite manner, thereby canceling its measurement. That is, a non-divergent (far) field would affect each of the corresponding field sensors with approximately equal magnitude, but with opposite polarity (owing to their installed configuration); thus by summing the outputs all common mode external magnetic fields would be cancelled.

While the teachings of the '059 patent are effective when dealing with far fields, a divergent near field can expose each of the two magnetic field sensors to distinctly different field intensities and direction. In this scenario, the two field sensor outputs will not reflect equal but opposite error components that cancel each other, but rather unequal and opposite components that introduce an error to the measurement. In practice, the configuration of the invention disclosed in the '059 patent is error-prone in the presence of locally divergent magnetic fields because the two magnetic field sensors experience different magnitudes of the divergent magnetic fields.

The difference in magnetic fields between the two magnetic field sensors originating from a near field source combines non-uniformly with torque induced magnetic fields and leads to a false torque value. Thus, it is important to eliminate this near field effect.

There are numerous other types of near field sources that can compromise an accurate torque-dependent field measurement. These sources include a permanent magnet, a magnetized wrench, a motor or solenoid, etc. Another would be the nearby presence of a ferromagnetic structure that distorts the shape and direction of the earth's magnetic field, creating a localized area in which the magnetic flux is concentrated in an undesirable direction. Each of these examples results in a divergent magnetic field, i.e., one in which there are significant local gradients in both magnetic field strength and flux direction.

There are numerous methods for canceling the effects of near field source or stray magnetic fields. These include employing shielding and using flux directors. Each of these types of structures is made from materials having a high magnetic permeability, meaning that they present a much lower resistance to magnetic fields than, for example, air. In principle, a shield would be in the form of a tube of infinite length, although shorter finite lengths may suitably function. Magnetic fields originating outside of the shield are effectively shunted through the highly permeable shield material, which prevents them from intersecting the field sensors. Using a different approach, a flux director "gathers" most of the torque dependent magnetic field and directs it into the magnetic field sensors. With this approach, the flux director geometry is such that its effectiveness of gathering the torque dependent magnetic field of interest is much greater than its effectiveness of gathering extraneous and error inducing magnetic fields, thus increasing the efficiency of the magnetic field sensors and hence, their signal to noise ratio.

While the shielding method noted above can be effective for external magnetic fields perpendicular to the axial direction of a shield in the form of a tube, this shield is very vulnerable to external magnetic fields in the axial direction of the tube which is open at both ends. Any external magnetic fields can transfer to the field sensors inside the shield through the sides of the shield which are open.

Flux director structures typically operate by gathering the radial flux component of the torque dependent magnetic field, and are therefore well suited for rejecting axially directed flux of external origin, however, flux directors tend to be susceptible to external fields perpendicular to the axis of the shaft.

A combination of tubular shielding and flux directors would act in a complimentary manner by effectively mitigating both axially and radially directed fields of external origin acting directly on the field sensing devices. However, such a combination has other shortcomings that limit its desirability in many applications including cost and packaging within the design If an external magnetic field source is directly contacted with the end of a shaft such as the end of the column of an electric power steering system, a strong external near field could transfer to the field sensors through the shaft as a result of diametric variations in the shaft or nearby magnetically coupled structures such as, for example, a bearing or mounting flange. Moreover, a typical manufacturing process for a column or shaft may include a magnetic particle inspection (MPI) process that involves a magnetization process for guiding magnetic particles into the defect sites for visualization of defects on column surface, and a demagnetization process after finishing the inspection. Frequently, demagnetization is not perfect, and there remains a remanent magnetic field in the column or shaft after the MPI process. Typical values of the remanent magnetic fields are between 10 and 100 Gauss. This relatively large external magnetic field can be directly transferred to the field sensors inside the shield, and can be non-uniformly summed with the torque-induced magnetic fields, corrupting the torque measurement. This means that there is no totally effective way to protect or shield external magnetic fields propagating through the shaft with current techniques.

An additional disadvantage of the shielding method is that any deformation of the shield device caused by mechanical impact or extreme temperature change can affect the relative position of the field sensors and the shield, which can lead to unbalancing of far field values between two sensor fields operating in pairs that are oppositely oriented. This would result in compassing failure.

Furthermore, in most torque sensor applications, packaging space is limited, and in many cases there is no room for a shield or flux director. In addition, the added financial cost for those components is not insignificant because materials with high permeability tend to have high percentages of nickel, the pricing of which is quite volatile.

Based on the foregoing, there is a need for a new and better technique for effectively canceling the effects of non-torque dependent magnetic fields without using shielding materials or flux directors. The present invention meets these requirements by special arrangement of field sensors so as to effectively eliminate or minimize measurement error resulting from divergent near fields without using shielding materials and flux directing devices.

SUMMARY OF THE INVENTION

The present invention is based on hardware and software for cancellation of external magnetic fields by placing three sets of magnetic field sensors above magnetic regions, or regions, conditioned on a shaft. The magnetic regions on the shaft consists of three sections: (1) central region, (2) right side region, and (3) left side region. A first or primary set of magnetic field sensors is located above the central region. A second set of secondary magnetic field sensors is located above the right side region. A third set of secondary magnetic field sensors is located above the left side region.

In this scheme, we utilize the fact that, beyond a certain distance between the near field source and the sensors, a magnetic field from an external near field source(s) decreases in a substantially linear fashion in relation to the distance from the external near field source. Magnetic field sensors placed closest to the external near field sources detect the largest near field value, magnetic field sensors placed farthest from external near field source detect the smallest near field value, and magnetic field sensors in the center sense an average value of the nearest and farthest sets of magnetic field sensors. The magnetic field sensors at the central region have opposite sensing polarity to the magnetic field sensors at the right side and left side regions. Thus, the near field measured by the primary magnetic field sensors at the central region is the same magnitude and opposite sign from the averaged values of the near field measured by the secondary magnetic field sensors at the right and left regions. The interconnects to the field sensors in combination with the associated electronics are configured so as to average the values of the left and right side regions and sum that average with the value of the center region sensor which, because it is oriented with an opposite polarity, effectively cancels the effects of the near field measurement error.

While the near field is cancelled out, the torque induced magnetic field measured by these three set of magnetic field sensors is not cancelled out because the output of the center region, or primary sensor, is not a common mode measurement with respect to the left and right region sensors.

In addition to the use the three contiguously magnetized regions as disclosed above, this arrangement of field sensors can be applicable to any number of magnetized regions on the shaft. For example, if this arrangement is applied to single magnetized region, the magnetic field sensors at the central primary region are placed proximate to the center of the single region. Magnetic field sensors located to the right and left side of the single magnetized region detect only the near field because the absence of magnetic polarization proximate to those secondary sensors results in the absence of a torque induced magnetic field.

In case of application to a three region magnetized shaft, the magnetic field sensors at the central region and magnetic field sensors at right side and left side regions measure both near field and torque induced magnetic field. The near field is cancelled out and torque induced magnetic field is measured.

Accordingly, it is a principal object of the present invention to provide a torque sensor and method for using the same having a magnetoelastically active region with one or more regions circumferentially magnetized in order to detect a torque-dependent magnetic flux emanating from the active region.

It is another object of the present invention to provide a torque sensor and method for using the same in which is provided an arrangement of magnetic field sensors proximate to the torque sensor such that the signal from the sensors measuring the torque-dependent magnetic flux from the active region may be compensated to substantially eliminate the effects of a near magnetic field source on the torque sensor.

Briefly described, those and other objects and advantages of the present invention are accomplished, as embodied and fully described herein, by a method for reducing the noise in a signal from a torque sensor caused by near magnetic field sources, the method including the steps of providing a torque sensor, receiving a first primary signal upon the application of a torque; receiving a second and a third secondary signals; and adjusting the first signal using the second and third signals thereby compensating for the effects of the near magnetic field source. The torque sensor includes at least a longitudinally extending member; a magnetoelastically active region directly or indirectly attached to/or forming a part of the surface of the member, the active region having at least one region magnetized in a first substantially circumferential direction in such a manner that torque applied to the member is proportionally transmitted to the active region; a plurality of primary magnetic field sensors arranged proximate the at least one region for outputting a first signal corresponding to a torque-dependent magnetic flux emanating from the active region; at least one secondary magnetic field sensor axially spaced in a first direction by a predetermined first distance from the plurality of active magnetic field sensors for outputting a second signal corresponding to an ambient magnetic flux emanating from the near magnetic field source; at least one secondary magnetic field sensor axially spaced in a second direction opposite the first direction by the pre-determined first distance from the plurality of active magnetic field sensors for outputting a third signal corresponding to the ambient magnetic flux emanating from the near magnetic field source.

DESCRIPTION OF THE SEVERAL DRAWINGS

DETAILED DESCRIPTION OF THE INVENTION

Figure 1:
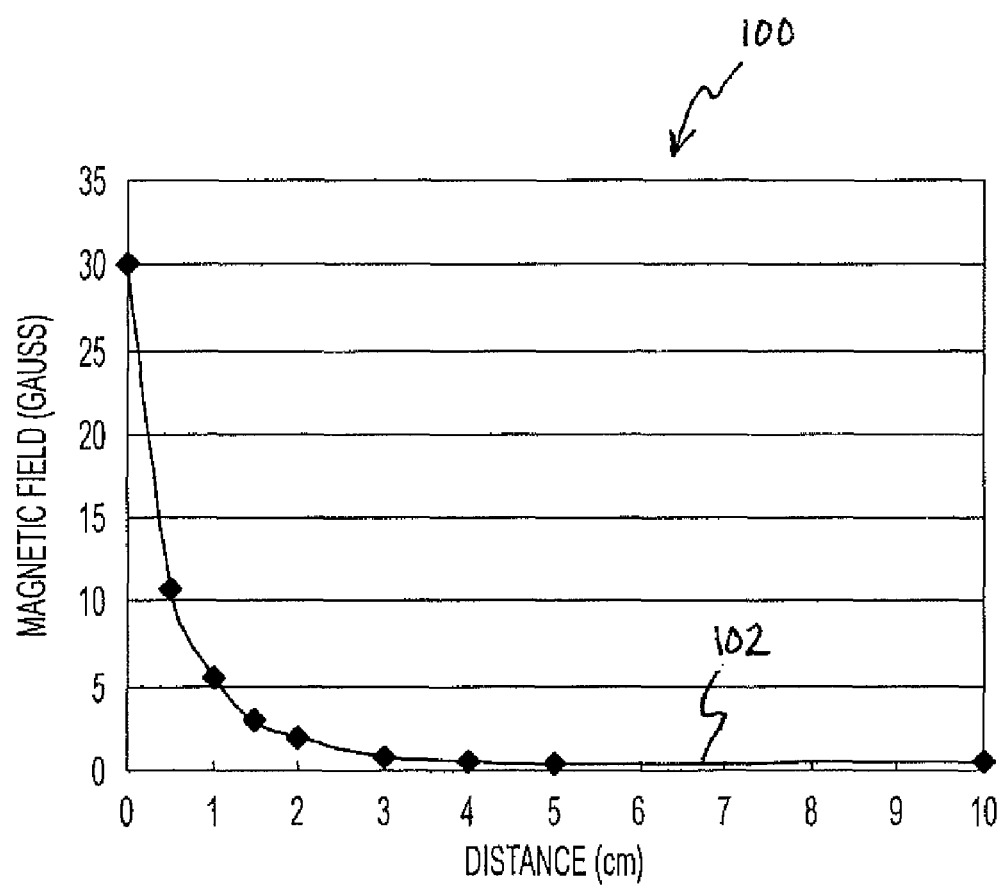
FIG. 1 is a graph of a magnetic field distribution associated with an Allen wrench measured along the axial direction using a Gauss probe in air.

Several preferred embodiments of the invention are described for illustrative purposes, it being understood that the invention may be embodied in other forms not specifically shown in the drawings. The figures will be described with respect to the system structure and methods for using the system to achieve one or more of the objects of the invention and/or receive the benefits derived from the advantages of the invention as set forth above.

U.S. Pat. No. 5,520,059 describes a torque sensor having a transducer and magnetic field vector sensor. The torque sensor is mounted on a shaft which is part of a machine, and it rotates about a central longitudinal axis. A torque having a magnitude T is applied at one portion of the shaft and is transmitted thereby to another portion of the shaft where the motion of the shaft due to the torque T performs some useful work. The torque may be in a clockwise or counterclockwise direction when looking at the visible end of the shaft, but obviously it can be applied to rotate the shaft in either or both directions depending on the nature of the machine incorporating the shaft.

The transducer is firmly attached to or integral to the shaft in one of a number of ways, and acts as a means for providing a magnetoelastically active region on the shaft. In practice, the transducer will generally take the form of a cylindrical sleeve or ring with end faces, an inner surface, and an outer surface, suitably attached to the shaft at a convenient location along the axis which is within the torsionally stressed region of the shaft, it may be an integral and homogeneous part of the shaft, or it may be an integral and homogeneous part of the shaft distinguished by having a different metallurgical phase than the rest of the shaft as disclosed in U.S. Pat. No. 6,047,605. The transducer is endowed, by prior processing or, in the case of a ring or collar, as a collateral effect to the means of attachment to the shaft, with an effective uniaxial magnetic anisotropy having the circumferential direction as the easy axis. In addition, the transducer will also be magnetically polarized in one or the other circumferential direction by any effective method, several of which are described in the '059 patent. Briefly, the active region of the transducer is magnetically polarized in a substantially purely circumferential direction, at least to the extent that, in the absence of the torque T (in a quiescent state), it has no net magnetization component in the direction of the axis and has no net radial magnetization components. Thus, the domains whose magnetizations originally had components in the opposite circular sense are substantially reversed such that all of the domains are of the same polarity. If the circular anisotropy is suitably dominant, all of the domain magnetizations will lie within at most a plus or minus 45 degree limit of the circumferential direction, and will be symmetrically distributed within small enough volumes of the ring or portion of the shaft to ensure that no uncompensated external flux is sensable by the magnetic field vector sensor. The closed cylindrical shape of the transducer enhances the stability of the polarization of the transducer by providing a complete magnetic circuit.

Due to the construction and processing of the transducer, specifically the magnetoelastic properties of the active region, the application of torsional stress to the shaft and thus to the active region of the transducer causes reorientation of the polarized magnetization in the transducer such that the magnetic domains align with principal stress axes. The polarized magnetization becomes increasingly helical as the torsional stress increases owing to the fact that torsional stress results in a helically aligned stress axis. The helicity of the magnetization in the transducer depends on the magnitude of the transmitted torque T, and the chirality is dependent on the directionality of the transmitted torque and the magnetoelastic characteristics of the transducer. The helical magnetization resulting from the torsion of the transducer has both an internal circumferential component in one direction an external axial component and an external radial component. As described below in more detail, the axial and radial components are within the same flux path, that is to say that the helicity of the magnetization results in magnetic flux existing at one boundary of the active region, traveling in space externally along the longitudinal axis of the shaft, and reentering the shaft at the opposite boundary of the active region. Of particular importance is that the magnitudes of both the radial and axial components depends entirely on the torsion in the transducer while the flux direction, or polarity, of both the radial and axial components are dependent upon the direction in which the torque is applied to the shaft.

The magnetic field vector sensor is a magnetic field vector sensing device located and oriented relative to the transducer so as to sense the magnitude and polarity of the axial and/or radial field components arising in the space about the transducer as a result of the reorientation of the polarized magnetization from the quiescent circumferential direction to a more or less steep helical direction. The magnetic field vector sensor provides a signal output reflecting the magnitude of the torque T. The magnetic field vector sensor preferably comprises one or more solid state sensing devices, such as Hall effect, magnetoresistance, magnetotransistor ("magnistor"), magnetodiode, or MAGFET (Magnetic Field Effect Transistor) field sensors. Other possible field sensors include non-linear cores, having magnetic properties varying with H (defined as a magnetizing force), magnetometers, and flux gate magnetometers, and coils (either encircling or proximate, intercepting flux and having an induced EMF proportional to $d\Phi/dt$, or change in magnetic flux over change in time). One or more wires connect the magnetic field vector sensor to a source of direct or alternating current power or excitation signal, and transmit the signal output of the magnetic field vector sensor to a receiving device, such as a control or monitoring circuit for the machine or system incorporating the shaft.

The '059 patent addresses the compassing issue seen with previous torque sensors by adding one or more magnetoelastically active regions (hereinafter simply referred to as a "region") adjacent the first region, which are also magnetized in the opposite circular direction to the first region that is used for torque-sensing purposes. Two sets of magnetic field sensors are placed on the first and second magnetic region. The magnetic field sensors in each set have opposite axial polarity to the other. Thus, a uniform magnetic field is cancelled due to this opposite arrangement of magnetic field sensors. When a non-uniform magnetic field is applied to the sensor system, the two sets of magnetic field sensors would see different values of the magnetic field.

Turning to FIG. 1, shown therein is a graph 100 of a magnetic field distribution 102 for an Allen wrench measured along the axial direction of the wrench using a Gauss probe in air as it is moved away from the wrench. As shown in FIG. 1, the magnetic field at the surface of the Allen wrench tail was 30 Gauss, and decreased as the distance increased from the tail. Thus, the Allen wrench emanates a non-uniform magnetic field source that decreases non-linearly until it reaches an asymptote, at which point it becomes substantially linear. If the end of the Allen wrench is brought close, for example, less than 1 cm, to the sensor system of the '059 patent, then the difference in the magnetic field seen by the two different sets of field sensors could easily be more that 20 Gauss. Magnetic field sources such as permanent magnets, solenoids, and magnetized ferromagnetic materials would show a similar magnetic field profile in air and have similar effects on the two different sets of field sensors.

Figure 2A:
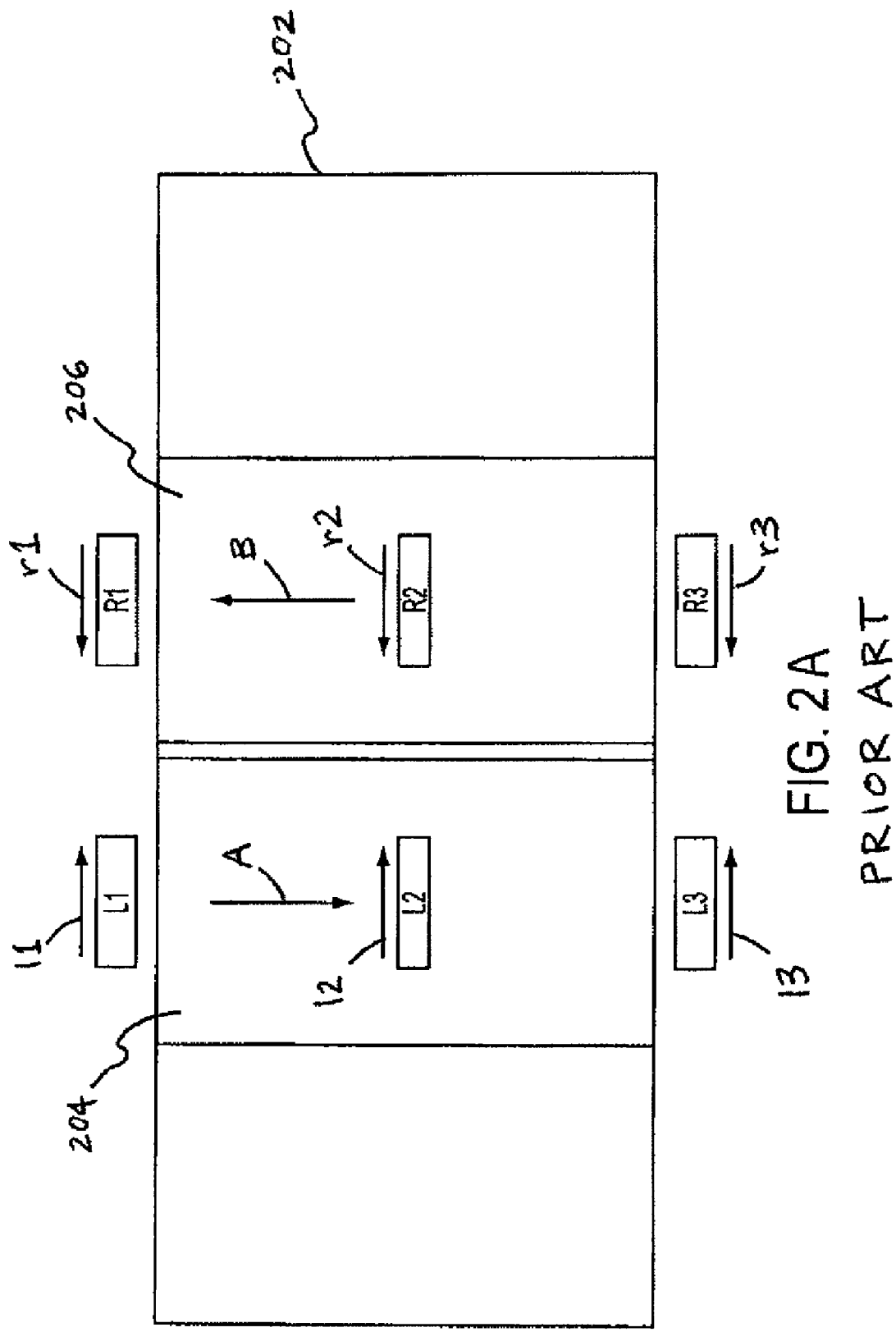
FIG. 2A is a schematic diagram of a shaft that has been circumferentially magnetized in opposite directions in two regions and four field sensors for each region (two of which are not visible)

Turning now to FIG. 2A, shown therein is a schematic diagram of a shaft 202 that has been circumferentially magnetized in opposite directions, as shown by the arrows A, B, in two regions, 204, 206, respectively. The shaft 202 may be solid or hollow, and it is preferably homogeneous, at least in the region of the two regions 204, 206. Each of the regions 204, 206, includes four field sensors arranged approximately equal distance from each other around and above the surface of the shaft 202. That is, field sensors L1, L2, L3, and L4 (not visible) are arranged around the region 204, and field sensors R1, R2, R3, and R4 (not visible) are arranged around the region 206. Each sensor may be arranged as shown by the respective arrows 11, 12, 13, 14, r1, r2, r3, r4, to detect the polarity of magnetic field emanating from the shaft 202 corresponding to the arrow directions.

FIG. 2A represents a sensor system disclosed in U.S. Pat. No. 5,520,059. The two magnetic regions 204, 206, having opposite circular directions are encoded on the shaft. There are four field sensors associated with each region to average out the undesirable rotational non-uniform field observed as the shaft 202 rotates that can result from inhomogeneity of the material composition or metalluricial phase and other factors. The magnetic field sensors on each magnetic region have opposite axial polarity to the other so that a uniform magnetic field along the axial direction can be cancelled out. A far magnetic field such as the Earth's magnetic field, can be cancelled out easily by pairing field sensors with opposite orientation to create a common mode rejection scheme as proposed in U.S. Pat. No. 5,520,059. However, as noted previously, that arrangement cannot easily eliminate near fields due to the non-uniform and short-range character of the magnetic near field as shown in FIG. 1.

Figure 2B:
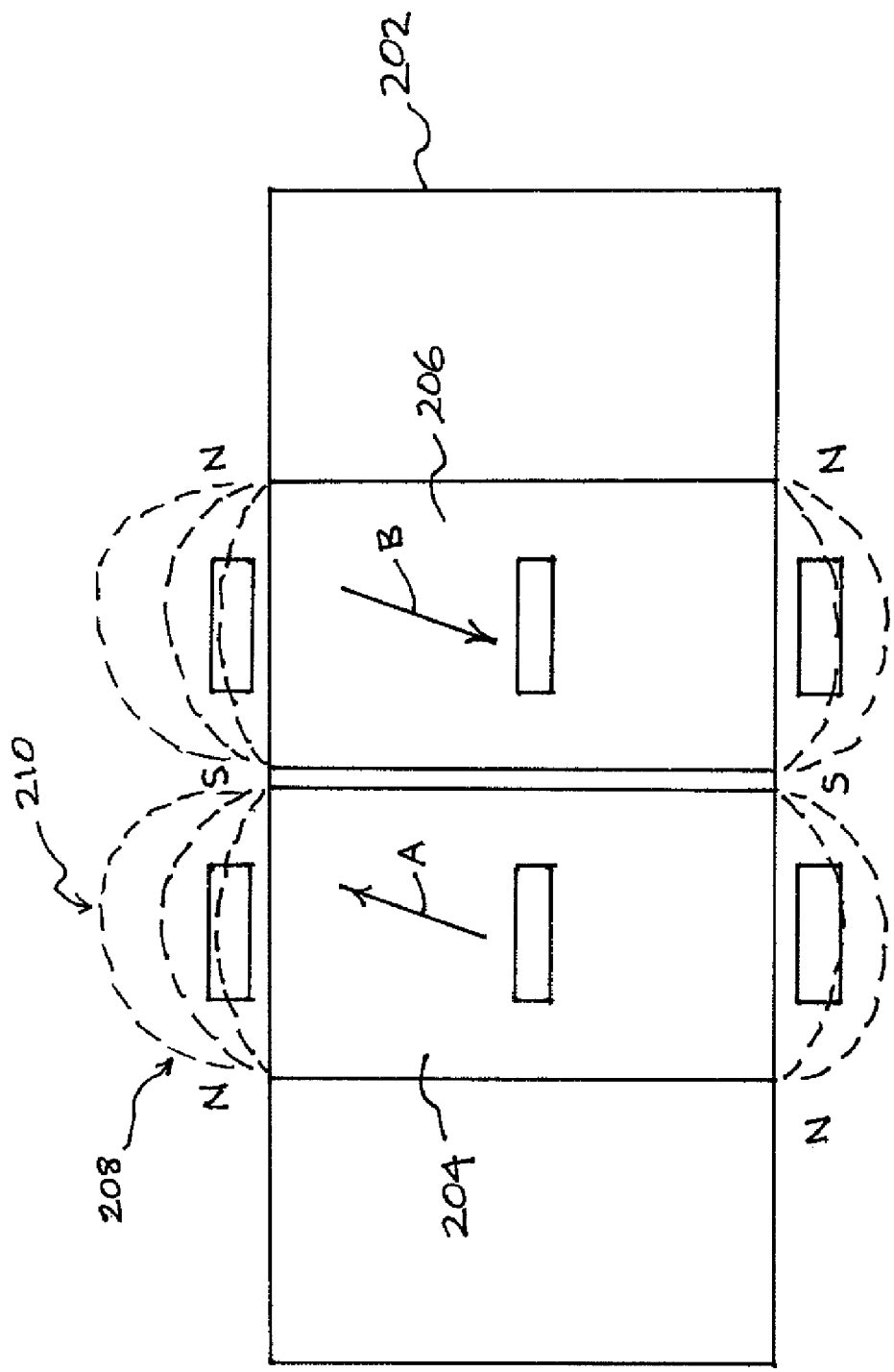
FIG. 2B is a schematic diagram of the shaft of FIG. 2A showing an external magnetic flux due to a torque applied to the shaft.
Figure 2C:
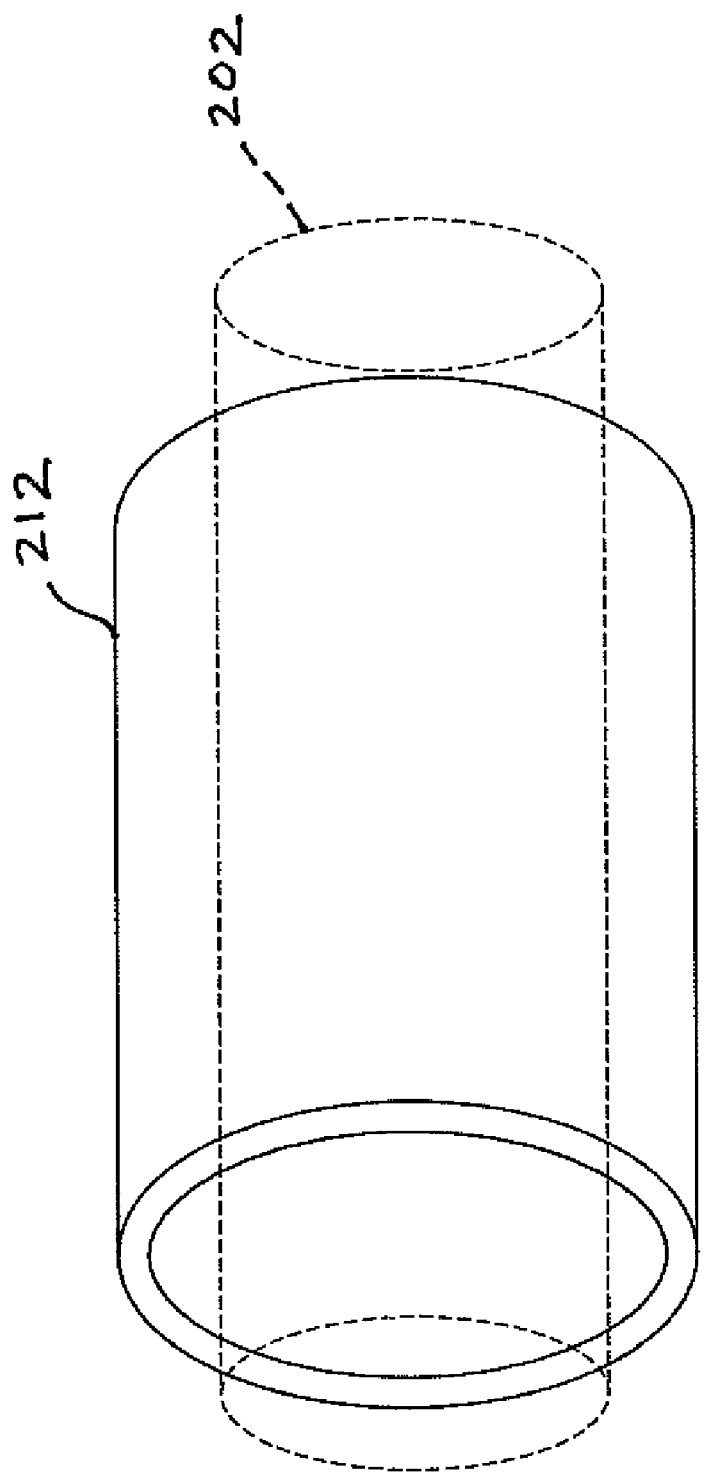
FIG. 2C is a perspective view schematic diagram of a bobbin around the shaft of FIG. 2A.
Figure 2D:
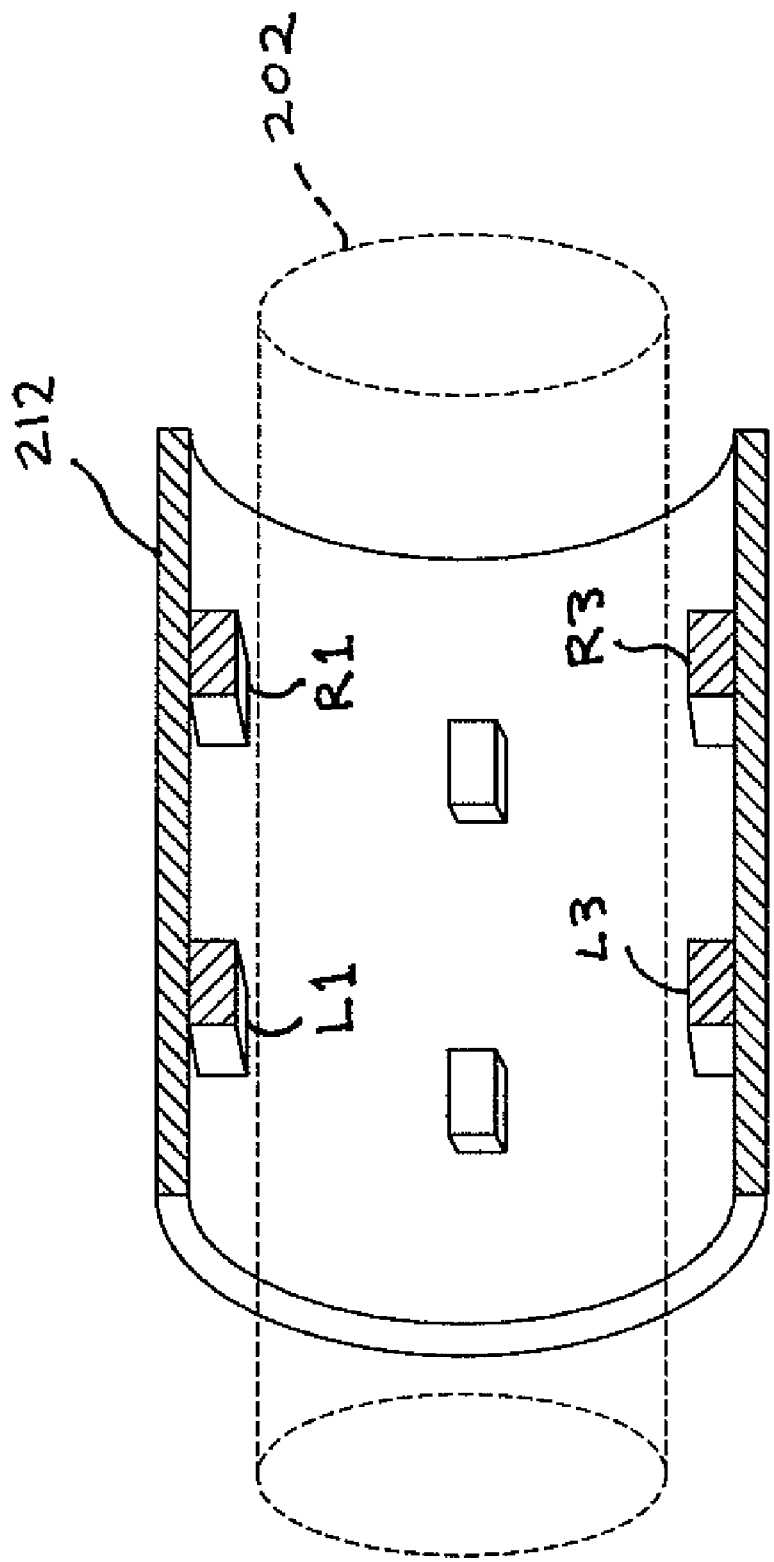
FIG. 2D is a perspective cross-sectional view of the bobbin of FIG. 2C.

FIG. 2B is a schematic diagram of the shaft 202 of FIG. 2A showing an external magnetic flux caused by a torsional load applied to the shaft 202, where the external magnetic flux can be described in terms of a radial component 208 and an axial component 210. FIG. 2C is a perspective view schematic diagram of a bobbin 212 around the shaft 202, which is used for, among other things, to hold the field sensors R1, R3, L1, and L2 in a fixed position above the surface of the shaft 202 (as best seen in FIG. 2D).

Figure 3:
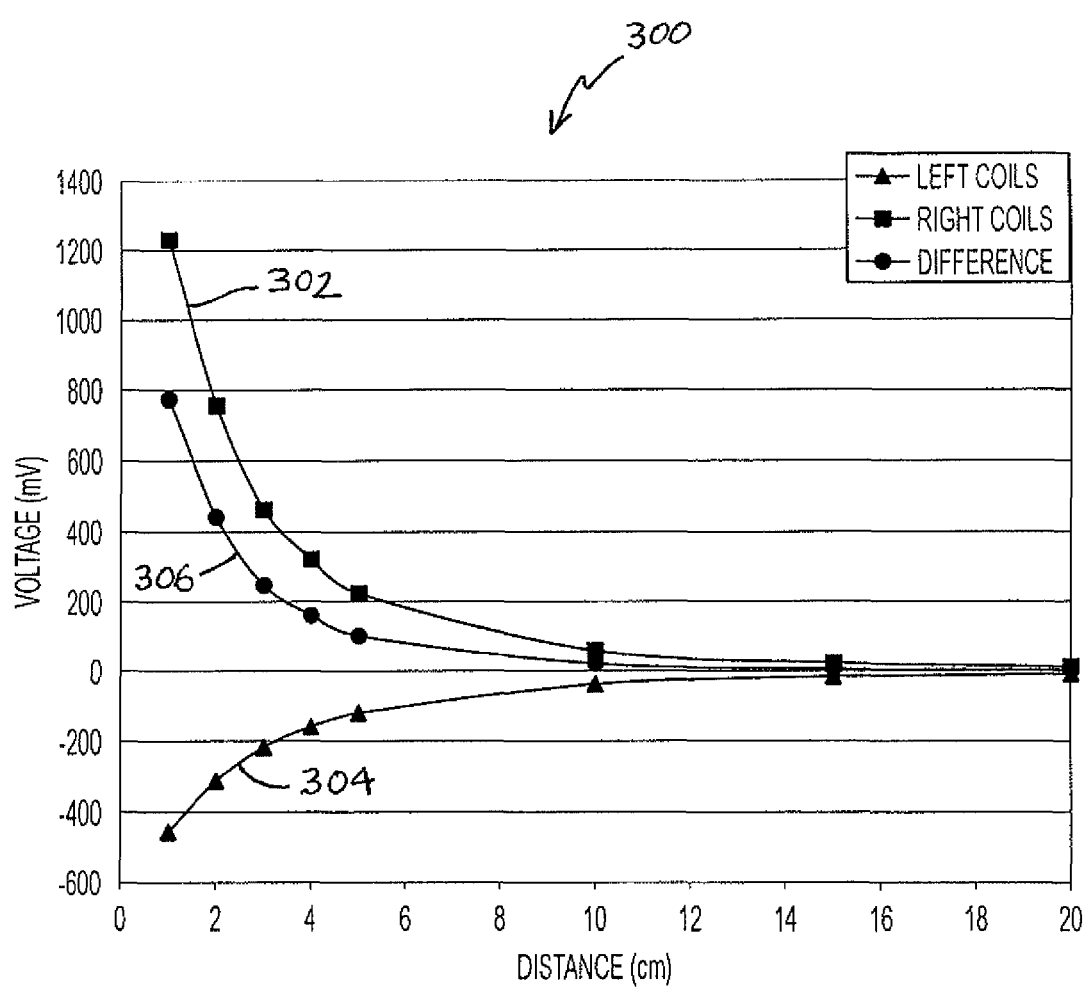
FIG. 3 is a graph showing a near field effect of the common mode rejection scheme measured in air according to one aspect of the present invention.

Turning now to FIG. 3, shown therein is a graph 300 depicting a near field effect of the common mode rejection scheme illustrated in FIG. 2A measured with the sensors mounted in a bobbin 212 and with no shaft present. The Y axis values represent the voltage output of the sensor interface electronics which is, in turn, representative of the measured magnetic field strength. A near field source was moved toward the right side, and aligned with the axis of the bobbin 212, producing a near field effect. In the graph 300, the aforementioned magnetized Allen wrench was used to simulate the near field effect. The line 302 (solid square symbols) represent a magnetic near field signal picked up by the magnetic field sensors R1, R2, R3, and R4. The line 304 (solid triangle symbols) represent magnetic near field signal picked up by the magnetic field sensors L1, L2, L3, and L4. The line 306 (solid circle symbols) is the difference between the values on line 302 and line 304. The line 306 shows that the common mode rejection scheme cannot reject a near field source located close to the field sensors.

As shown in the graph 300, the signal seen by the field sensors R1, R2, R3, and R4 is stronger than the signal seen by the field sensors L1, L2, L3, and L4 because the near field source (Allen wrench) is located in the right side of the bobbin 212, so it is closer to the field sensors R1, R2, R3 and R4. The opposite sign between the line 302 and the line 304 is due to the opposite axial polarity of the field sensors R1, R2, R3, and R4, and the field sensors L1, L2, L3, and L4. If the right and left field sensors see the same magnitude of the near field, the addition of the signals from the two sets of field sensors should be zero, which would eliminate the near field effect. However, that is not the case, as shown by line 306, which shows the resultant imbalance of right side versus left side sensor outputs.

Figure 4:
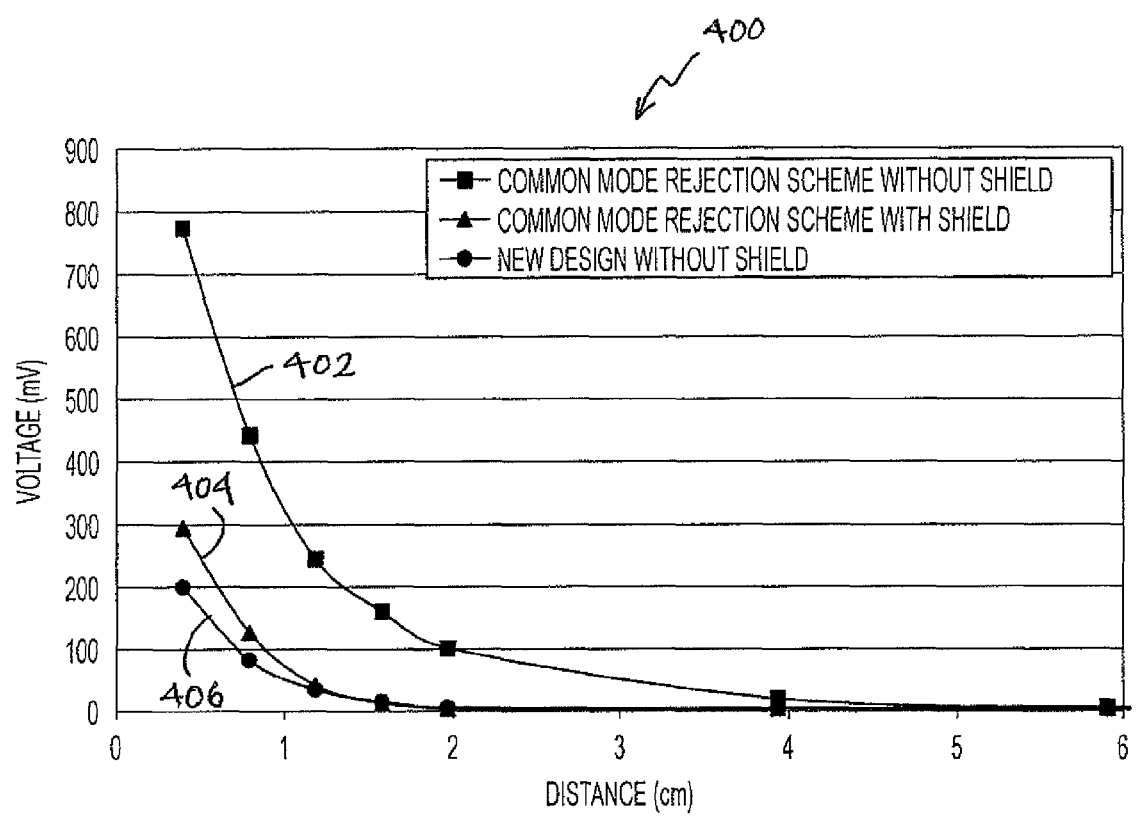
FIG. 4 is a graph comparing a near field effect between the common mode rejection method and a new method of the present invention.

Turning now to FIG. 4, shown therein is a graph 400 comparing the near field effect between the common mode rejection method currently used, the near field effect of the common mode rejection method currently used but with the addition of a tubular shaped shield surrounding and comprising the outer surface of the bobbin 212, and the method according to the present invention. In each case, only a bobbin 212 holding a sensor array was used for illustrative purposes, i.e., there was no shaft present. The Y axis values represent the voltage output of the sensor interface electronics which is, in turn, representative of the measured magnetic field strength. A near field source was moved toward the right side, and aligned with the axis of the bobbin 212. In the graph 400, the line 402 (solid square symbols) represents the prior art common mode rejection method without a shield. The line 404 (solid triangle symbols) represents the prior art common mode rejection method with a cylindrical open tube shield fabricated from Fe-Si high permeability material. The line 406 (solid circle symbols) represents the common mode rejection method according to the present invention. As shown in the graph 400, using a shield improves the cancellation effect of a near field, but a large amount of the interfering magnetic field is still seen, especially when the near field source is close to the bobbin 212 containing the sensor array. As shown by line 406, a statistically significant improvement in the cancellation of the near field effect was achieved with the method of the present invention.

Figure 5:
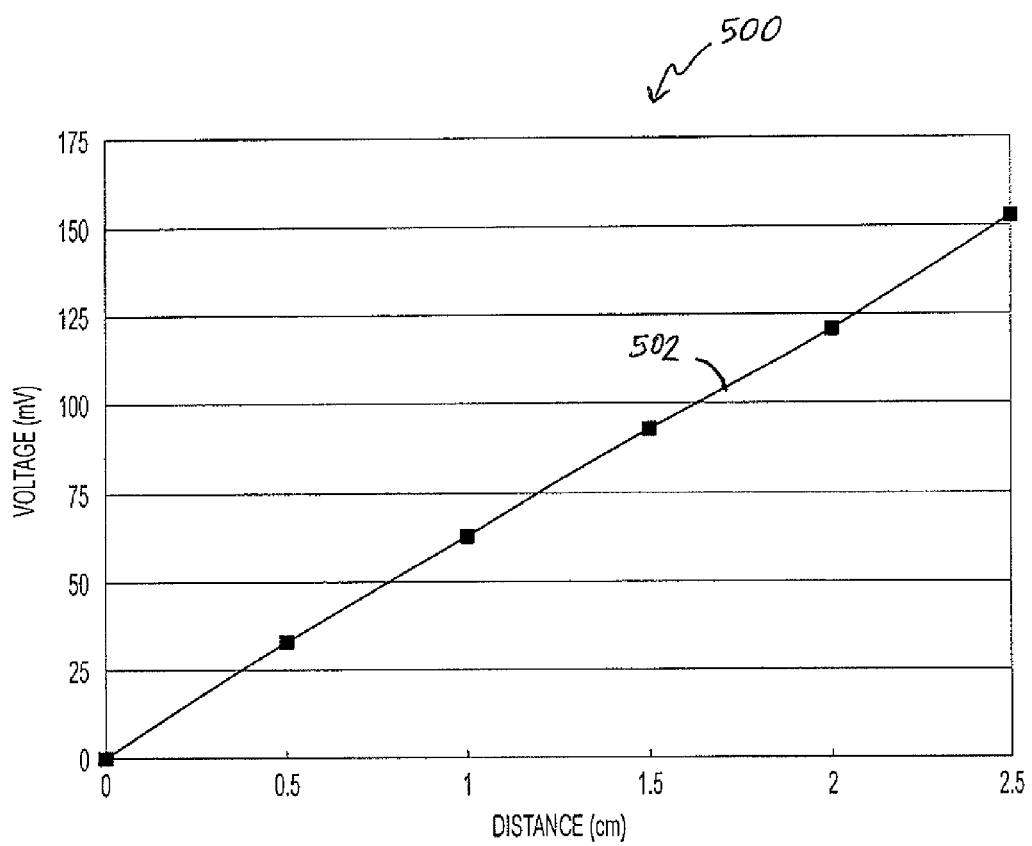
FIG. 5 is a graph showing the output response to an axial component of a magnetic field measured along a shaft using a fluxgate sensor.

Turning back to FIG. 1, the magnetic field of the near source represented by the line 102 can be considered to decrease linearly piecewise. The measurement in FIG. 1 was performed using a Gauss probe. No high permeability materials were located around the wrench and the Gauss probe. When a magnetic field source is contacted with the end of a cylindrical shaft made of soft magnetic material, the magnetic field on the surface of the shaft shows a wide ranging linear decrease in the magnetic field from the contact point of the magnetic field source as shown in FIG. 5, which is a graph 500 of the output response to an axial component of a magnetic field measured along a shaft using a fluxgate sensor. In this case, the magnetized Allen wrench of FIG. 1 contacts the end of the shaft. The magnetic field was measured using a fluxgate sensor coil. The long axis of the sensor coil, which is the axis of maximum sensitivity, was parallel to the cylindrical axis of the shaft and the coil was offset about 1 mm from the surface of the shaft. The reference position of the scan and the output voltage from the fluxgate sensor coil at the reference positions were set to (0,0). The distance between the reference position and the end position of the scan was 2.5 cm. Thus, the starting point for line 502 at distance 0 is away from the near field source and approaches the near field source at distance 2.5. As the fluxgate sensor moves closer to the near field source, the signal increases linearly. This linear behavior shown in line 502 is due to the high permeability material that confines the diverging magnetic fields in the shaft 202.

Figure 6:
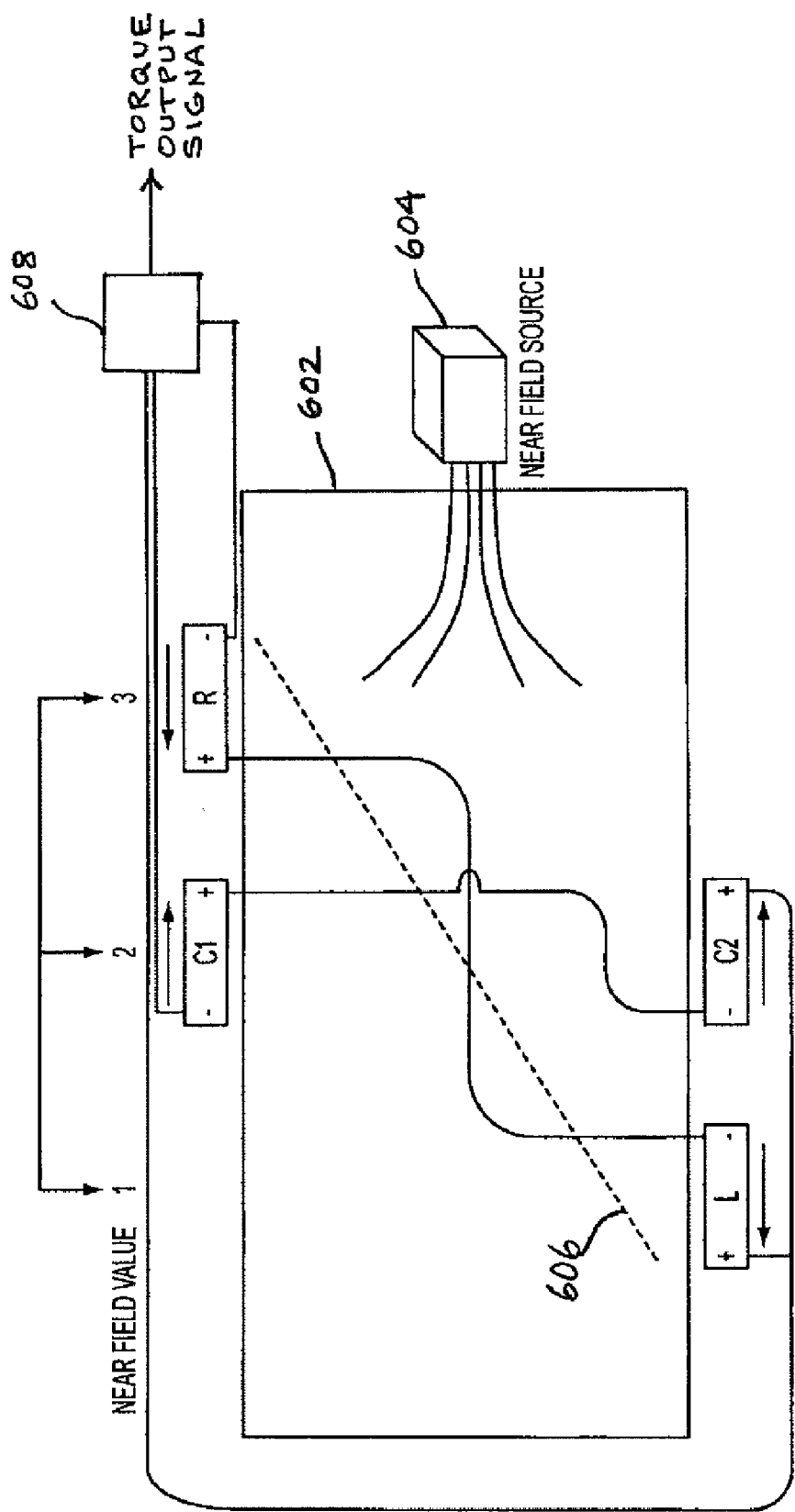
FIG. 6 is a schematic diagram showing the placement of magnetic field sensors around a shaft according to the present invention so as to cancel out near field effects.

Turning now to FIG. 6, shown therein is a schematic diagram in which primary magnetic field sensors C1 and C2 and secondary field sensors R and L are shown arranged around a shaft 602 according to the present invention, such that they cancel out near field effects from a near field source 604. The two primary field sensors C1 and C2 are arranged above the surface of the shaft 602 approximately near the center of the shaft 602 relative to the two ends of the shaft 602. One secondary sensor coil R is arranged above the surface of the shaft 602 closer to the right side of the shaft 602. One secondary sensor coil L is arranged above the surface of the shaft 602 closer to the left side of the shaft 602.

The near field source 604 is located, as shown, on the right side of the shaft 602. It may be in contact with the end of the shaft 602.

The shaft 602 is not magnetically conditioned. Therefore, the magnetic field sensors C1, C2, R, and L would only see the magnetic near field created by the near field source 604. The profile of the magnitude of the magnetic field along the longitudinal direction of the shaft will look like the dotted line 606, and increase linearly from left to right, as also shown in FIG. 5.

Table 1 shows a calculation of the near field effect seen by the four sensors C1, C2, R, and L due to the magnetic field from the near field source 604. The magnitude of the near field seen by the sensor R is larger than the magnitude seen by all the field sensors because it is physically closest to the near field source 604. The magnitude of the near field seen by the sensor L is smaller than the magnitude seen by all the field sensors because it is physically farthest from the near field source 604. If the distances between the field sensors R and C1 or C2 and the distances between the field sensors L and C1 or C2 are the same, then one can tabulate the near field distribution as shown in Table 1. In the example of Table 1, the maximum measurement value is normalized to 3 generic units for illustrative purposes. The actual computation of the net near field effect value shown in Table 1 could be performed by an arithmetic logic unit (ALU) 608.

TABLE 1

Near field effect calculation.

| Position | Near field value | Near field value seen by coil | Net near field effect |
| --- | --- | --- | --- |
| C1 | 2 | 2 | 0 |
| C2 | 2 | 2 | |
| R | 3 | −3 | |
| L | 1 | −1 | |

Figure 7:
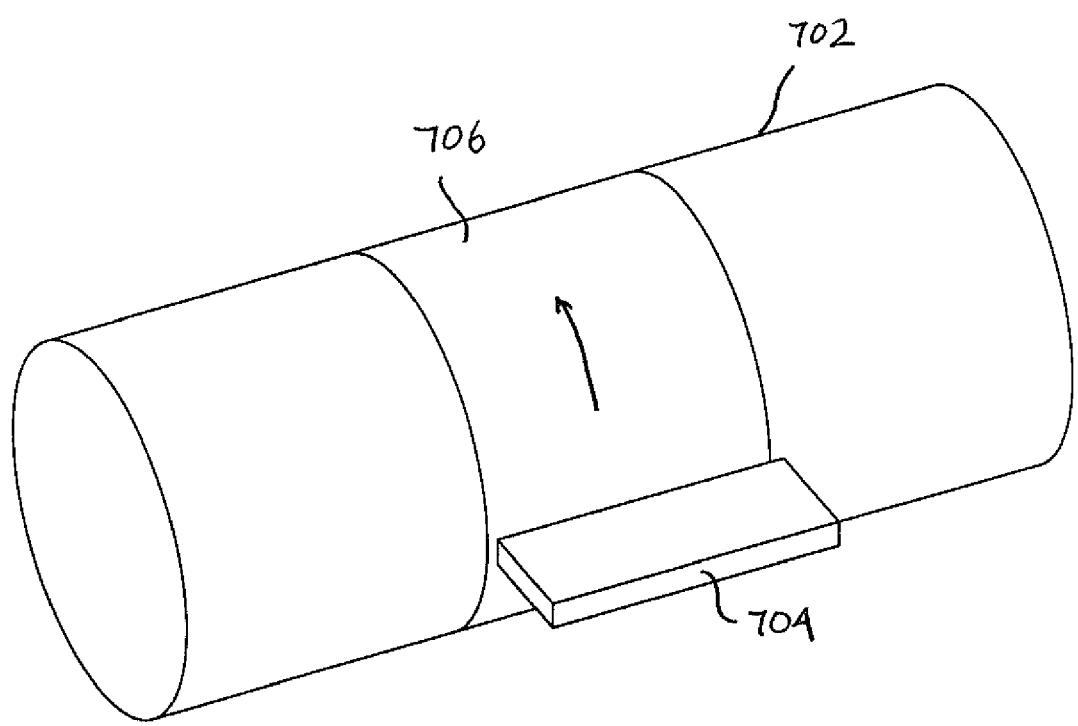
FIG. 7 is a perspective view drawing showing a single magnet for magnetization of a shaft to form a single region.
Figure 8:
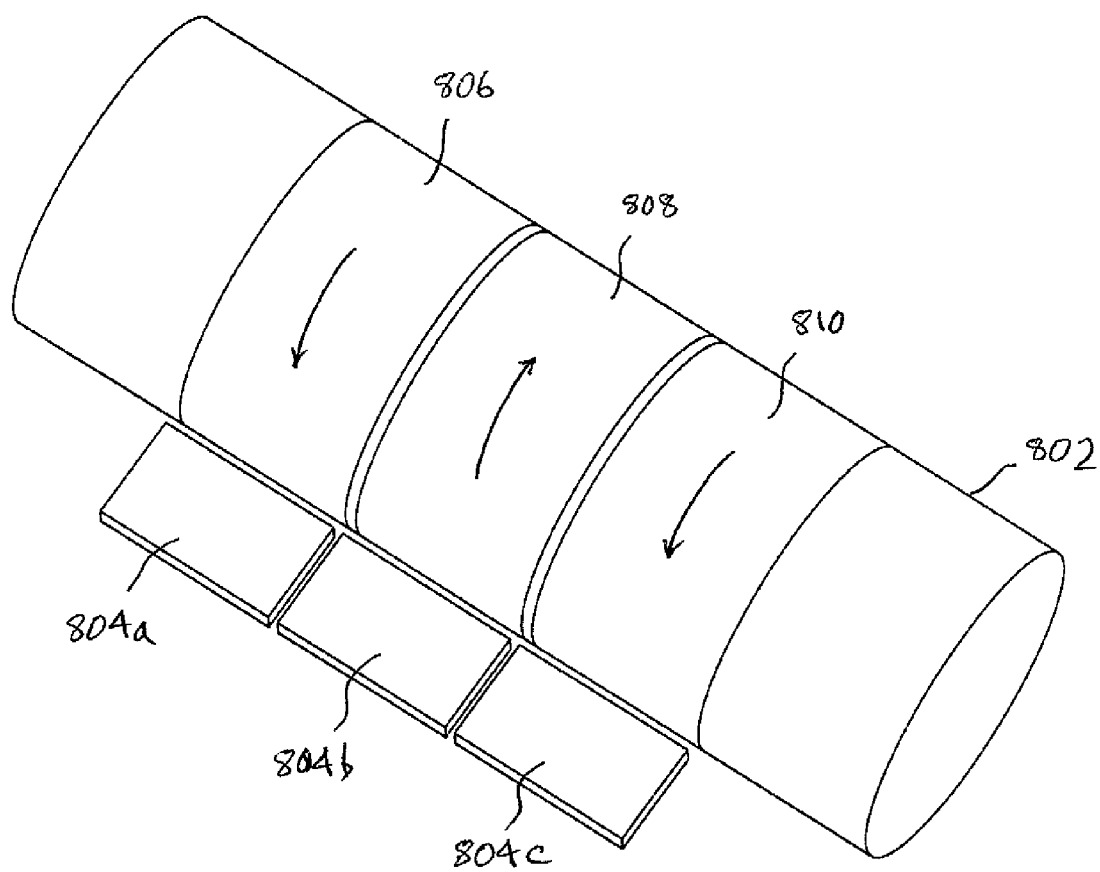
FIG. 8 is a perspective view drawing showing three magnets for magnetization of shaft to form three regions.

Turning now to FIGS. 7 and 8, shown therein are perspective view drawings showing, in one case, a single magnet 704 used to remanantly magnetize or condition a shaft 702 to form a single region 706 having a circumferential magnetization, and in the other case, three magnets 804a, 804b, and 804c used to remanently magnetize or condition a shaft 802 to form three regions 806, 808, 810. The direction of magnetization of the center magnet 804b is opposite to the other two magnets 804a and 804c. Thus, the direction of the circumferential magnetization in the central region 808 is opposite the circumferential magnetization in the regions 806 and 810, as indicated by the direction of the arrows.

Figure 9:
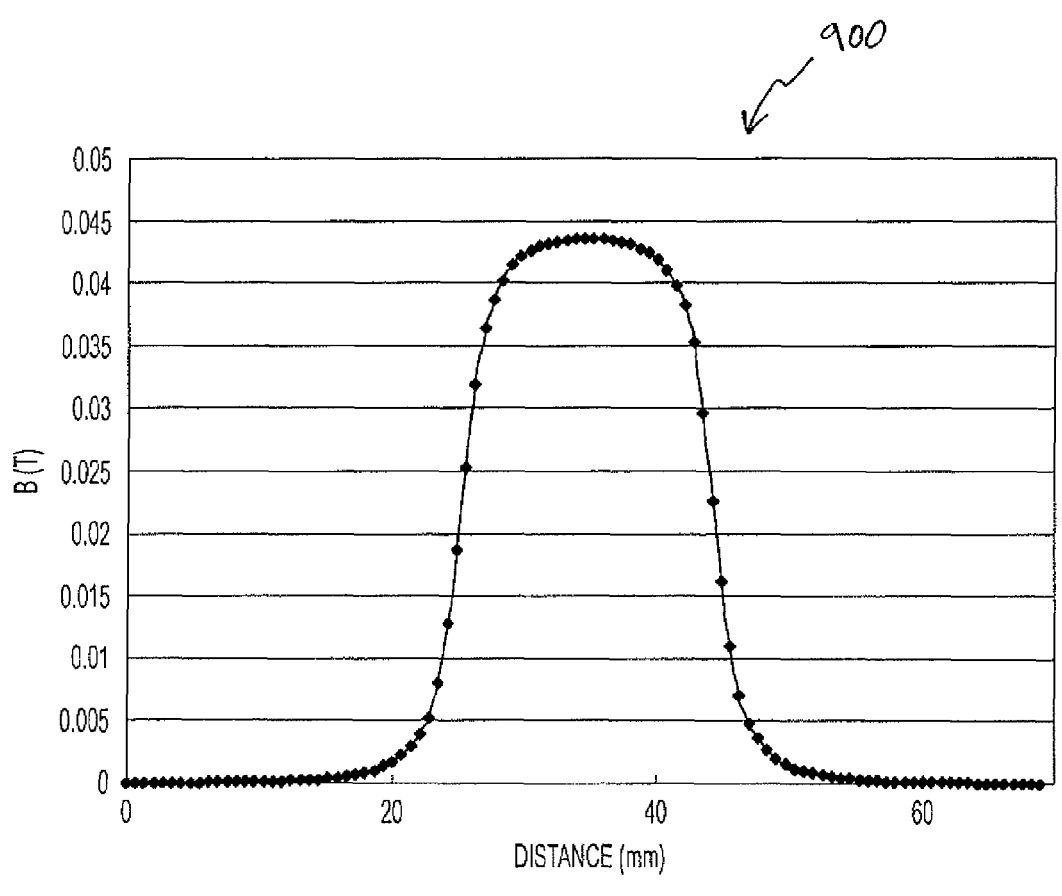
FIG. 9 is a graph showing the axial component of magnetic field originated from a shaft when the shaft is magnetized using a single magnet according to FIG. 7.
Figure 10:
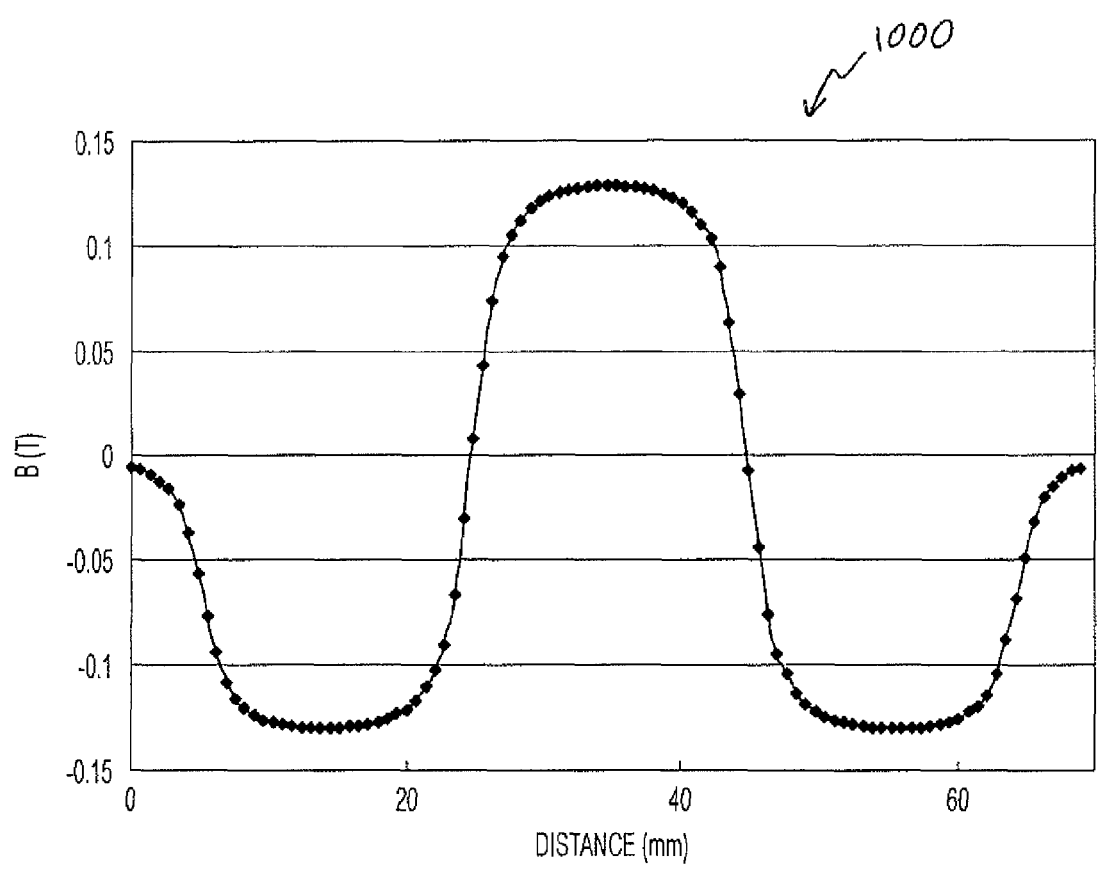
FIG. 10 is a graph showing the axial component of magnetic field originated from a shaft when the shaft is magnetized using three magnets according to FIG. 8.

FIG. 9 is a graph 900 showing the axial component of the magnetic field originating from the shaft 702 when the shaft 702 is magnetized using the single magnet 704 according to FIG. 7 and some nominal amount of torque is applied to the shaft in order to generate a torque dependent magnetic field. FIG. 10 is a graph 1000 showing the axial component of the magnetic field originating from the shaft 802 when the shaft 802 is magnetized using the three magnets 804a, 804b, 804c according to FIG. 8 and some nominal amount of torque is applied to the shaft in order to generate a torque dependent magnetic field. As can be seen in FIGS. 9 and 10, the magnetic profiles of the axial components of the magnetic field emanating from shafts 702 and 802 are symmetrical in shape.

Figure 11:
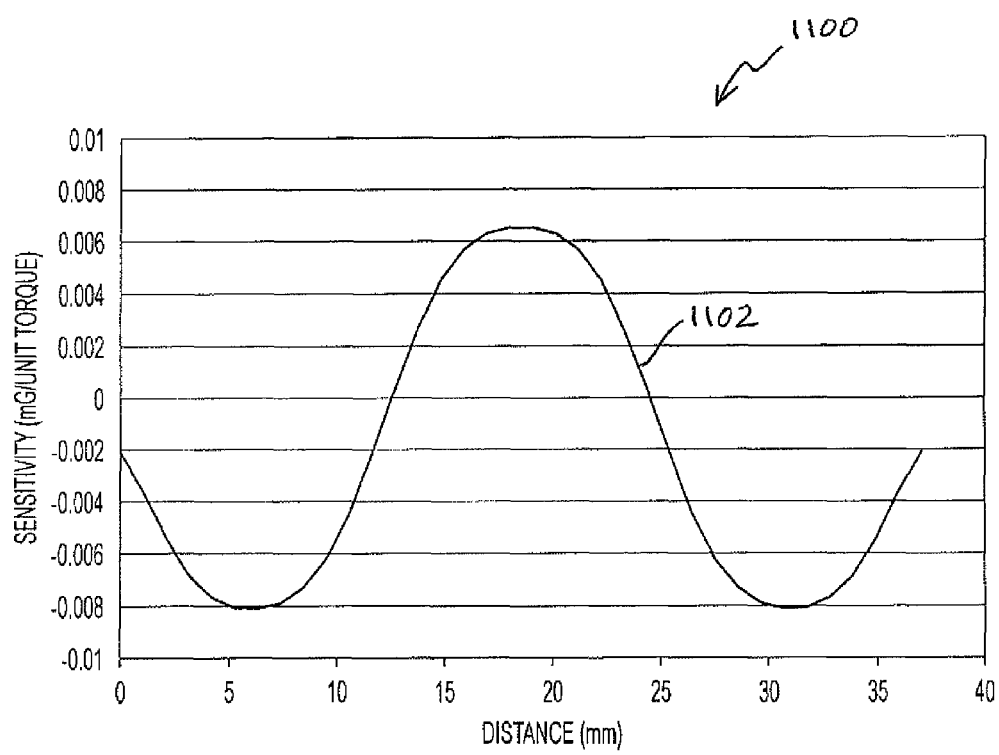
FIG. 11 is a graph showing the mapping of the sensitivity of a shaft magnetized with three magnets according to FIG. 8.

Turning now to FIG. 11, shown therein is a graph 1102 of a mapping of the sensitivity of the shaft 802 after it has been magnetized with the three magnets 804a, 804b, 804c, according to FIG. 8, in which a torque T is applied to the shaft 802. The center of the line 1102 shows a positive level of sensitivity, which corresponds to the torque-dependent field arising from the center region 808. The two negative levels of sensitivity corresponding to the right and left regions 806, 810 which were circumferentially magnetized in opposite polarity to that of the center region 808.

Magnetic field sensors were arranged around the shaft 802 at a position corresponding to the peak positive level of sensitivity as shown in the graph 1102 so that maximum torque-induced magnetic field would be seen. If, in an application of the present invention there are space limitations or geometry concerns, one or more field sensors to the right and left may be positioned a distance from the peak positive level of sensitivity with some loss of sensor sensitivity without departing from the nature and scope of the present invention.

Figure 12:
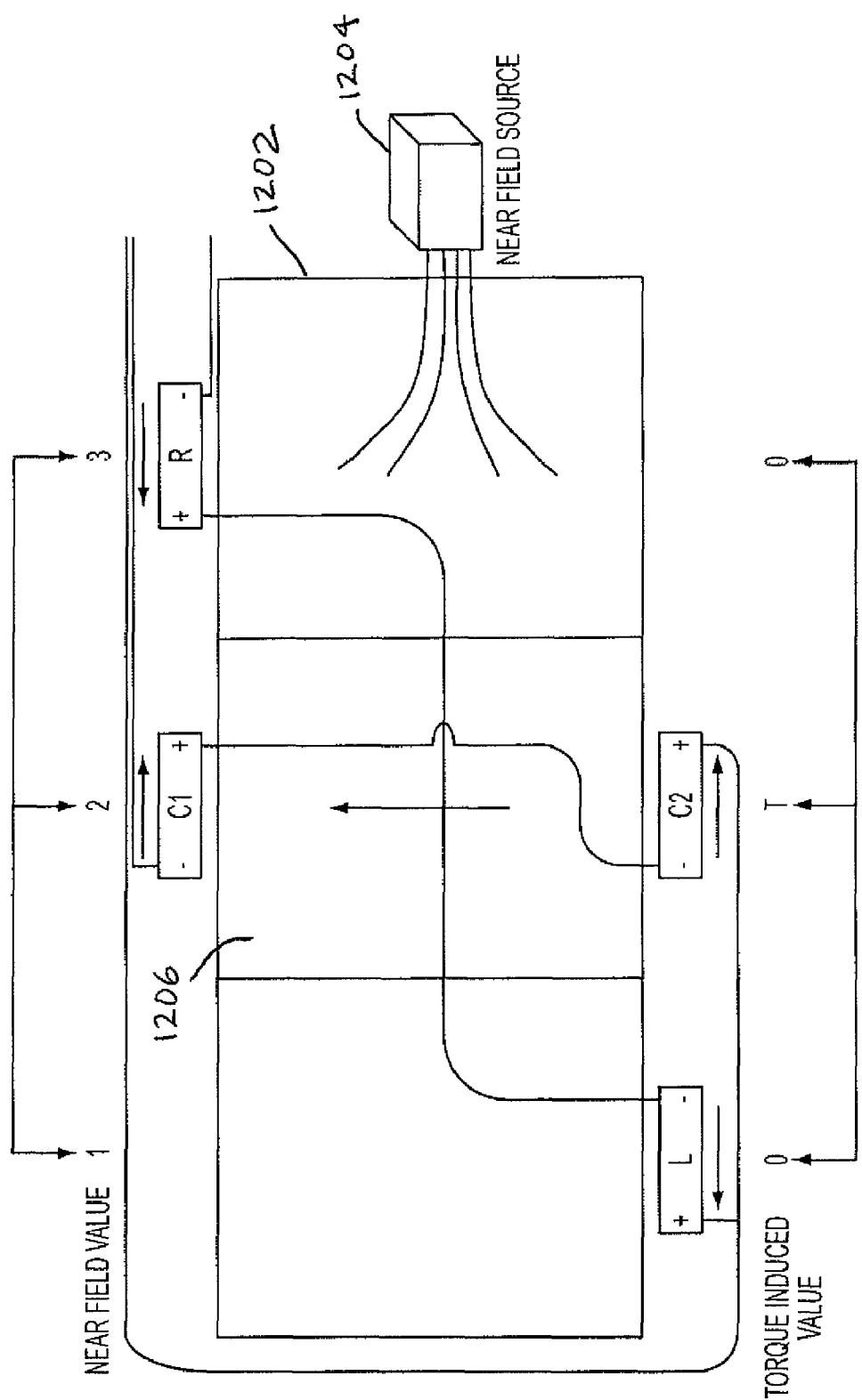
FIG. 12 is a schematic diagram showing the placement of magnetic field sensors around a shaft having a single region according to the present invention so as to cancel out near field effects.

FIG. 12 is a schematic diagram showing the placement of magnetic field sensors C1, C2, R, and L around a shaft 1202 having a single region 1206 according to the present invention, which is an arrangement for canceling out the magnetic near field effects from the near field source 1204. The shaft 1202 is magnetically conditioned with a single magnet (not shown), thereby forming the region 1206 having a remnant circumferential magnetization in the shaft 1202.

The primary magnetic field sensors C1, C2 near the center of the shaft 1202 measure the torque-induced magnetic field from the region 1206 and the magnetic near field from the near field source 1204. The secondary magnetic field sensors R, L at the right and left side of the shaft 1202, respectively, measure only the magnetic near field because no magnetic regions exist on the regions of the shaft 1202 where those field sensors are arranged. Table 2 shows a calculation of the torque-induced magnetic field and the magnetic near field effect seen by the four field sensors C1, C2, R, and L in FIG. 12, which may be implemented by use of appropriate arithmetic logic unit circuits and/or software element(s) that are well known to those skilled in the art. The unwanted magnetic near field is cancelled out, and only the torque-induced magnetic field sensed by the primary field sensors C1, C2 near the region 1206 remains. In the example of Table 2, the maximum measurement value is normalized to 3 generic units for illustrative purposes. The actual computation of the net near field effect value and the net torque-induced field value shown in Table 2 could be performed by an arithmetic logic unit (ALU) (as shown in FIG. 6, for example).

TABLE 2

Magnetic field effect calculation for three regions

| Position | Near field value | Near field value seen by coil | Net near field effect | Torque-induced field value | Torque-induced field value seen by coil | Net torque-induced field value |
|---|---|---|---|---|---|---|
| C1 | 2 | 2 | 0 | T | T | 2T |
| C2 | 2 | 2 |   | T | T |   |

TABLE 2-continued

Magnetic field effect calculation for three regions

| Position | Near field value | Near field value seen by coil | Net near field effect | Torque-induced field value | Torque-induced field value seen by coil | Net torque-induced field value |
|---|---|---|---|---|---|---|
| R | 3 | −3 |   | 0 | 0 |   |
| L | 1 | −1 |   | 0 | 0 |   |

Figure 13:
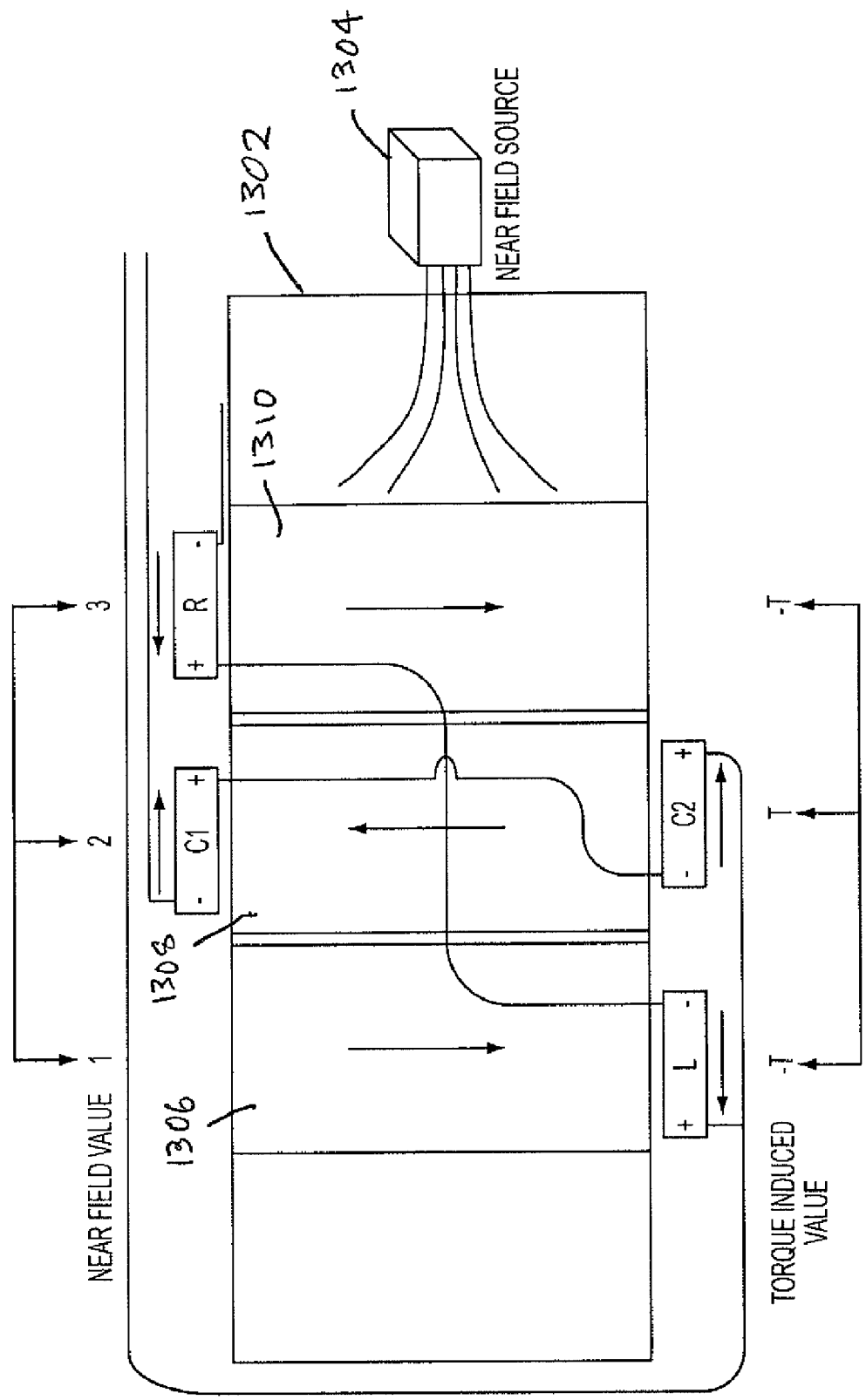
FIG. 13 is a schematic diagram showing the placement of magnetic field sensors around a shaft having three regions according to the present invention so as to cancel out near field effects.

FIG. 13 is a schematic diagram showing the placement of primary magnetic field sensors C1 and C2 and secondary magnetic field sensors R and L around a shaft 1302 having three magnetized regions 1306, 1308, 1310, according to the present invention, which is an arrangement for cancelling out the magnetic near field effects from the near field source 1304. The shaft 1302 is magnetically conditioned using three magnets (not shown), thereby forming the regions 1306, 1308, 1310, having remnant circumferential magnetizations in the shaft 1302.

The primary magnetic field sensors C1 and C2 measure the torque-induced magnetic field and the magnetic near field emanating from the center region. The secondary field sensors R and L, at the right and left side of the shaft 1302 measure the torque-induced magnetic fields emanating from the right and left sides of the shaft, respectively, as well as the magnetic near fields at those locations. While the magnetic near field measured by the secondary field sensors R and L is canceled out by the magnetic near field as measured by the primary field sensors C1 and C2 (because they are oppositely oriented), the torque-induced magnetic fields seen by field sensors C1 and C2 are not canceled out by the values measured by the secondary field sensors R and L. Actually, the torque-induced magnetic fields are additive due to the oppositely polarized magnetization between the center region 1308 and the regions 1306 and 1310. Table 3 shows a calculation of the torque-induced magnetic field and the magnetic near field effect seen by the four field sensors C1, C2, R, and L in FIG. 13, which may be implemented by use of appropriate arithmetic logic circuits and/or software elements that are well known to those skilled in the art. The unwanted magnetic near field is cancelled out, and only the torque-induced magnetic field is seen by the primary field sensors C1, C2 at the center region 1308. The torque-induced magnetic fields emanating from side regions 1306 and 1310 are doubled by adding the values from the secondary field sensors R and L. In the example of Table 3, the maximum measurement value is normalized to 3 generic units for illustrative purposes. The actual computation of the net near field effect value and the net torque-induced field value shown in Table 3 could be performed by an arithmetic logic unit (ALU) (as shown in FIG. 6, for example).

TABLE 3

Magnetic field effect calculation for three regions

| Position | Near field value | Near field value seen by coil | Net near field effect | Torque-induced field value | Torque-induced field value seen by coil | Net torque-induced field value |
|---|---|---|---|---|---|---|
| C1 | 2 | 2 | 0 | T | T | 4T |
| C2 | 2 | 2 |   | T | T |   |

TABLE 3-continued

Magnetic field effect calculation for three regions

| Position | Near field value | Near field value seen by coil | Net near field effect | Torque-induced field value | Torque-induced field value seen by coil | Net torque-induced field value |
|---|---|---|---|---|---|---|
| R | 3 | −3 | | −T | T | |
| L | 1 | −1 | | −T | T | |

Figure 14:
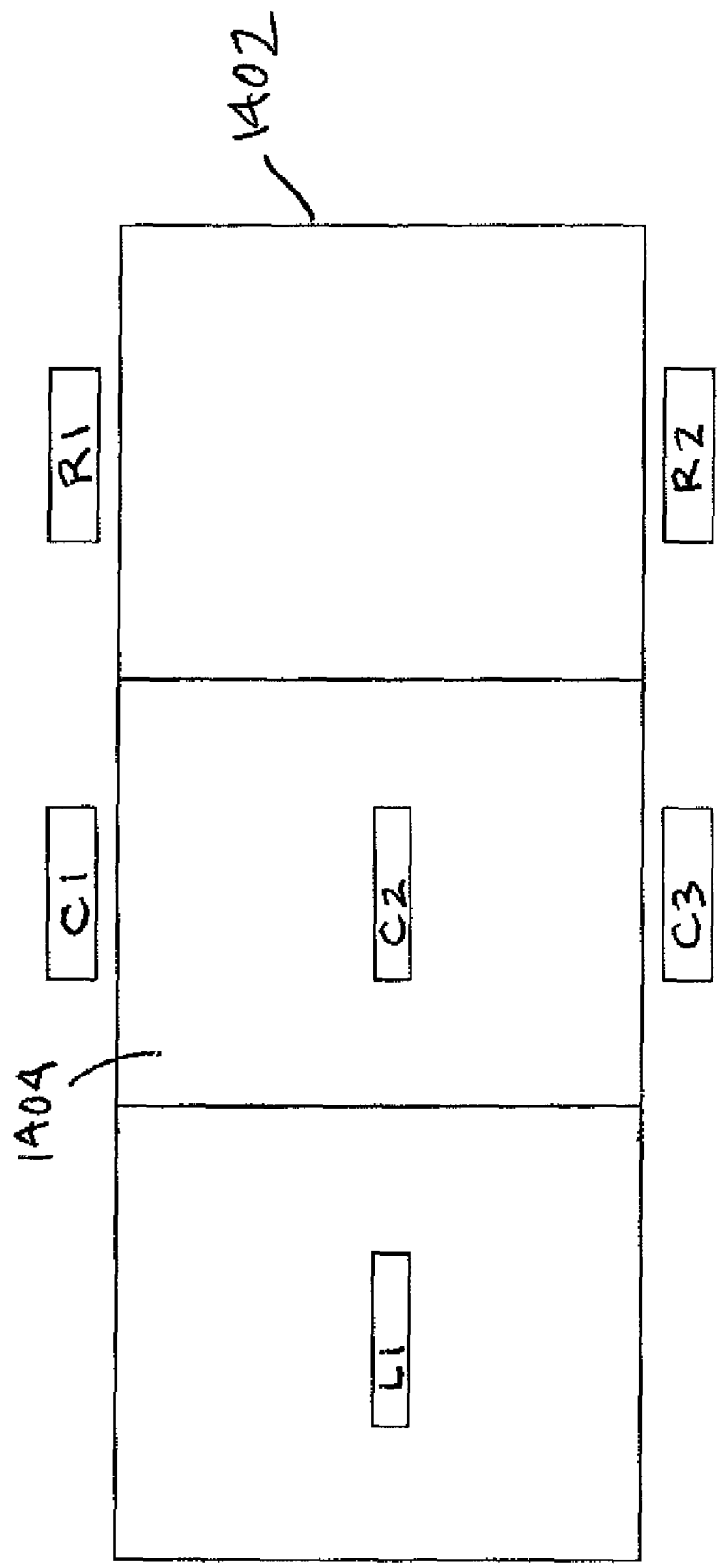
FIG. 14 is a schematic diagram of a shaft having a single region showing the placement of eight field sensors around the shaft (only six are visible) to improve rotation signal uniformity compared to using only four field sensors.

FIG. 14 is a schematic diagram of a shaft 1402 having a single region 1404 showing the placement of eight field sensors around the shaft 1402 (only six are visible) to improve the rotational signal uniformity of the magnetic fields seen by the field sensors compared to using only four field sensors. Primary magnetic field sensors C1, C2, C3, C4 (not visible) are arranged approximately equidistant from each other around and above the surface of the shaft and approximately in the center of the region 1404. The pair of secondary field sensors R1, R2 and the pair of secondary field sensors L1, L2 (not visible) are spaced approximately the same distance from the field sensors C1, C2, C3, C4 in a longitudinal direction of the shaft 1402.

Figure 15:
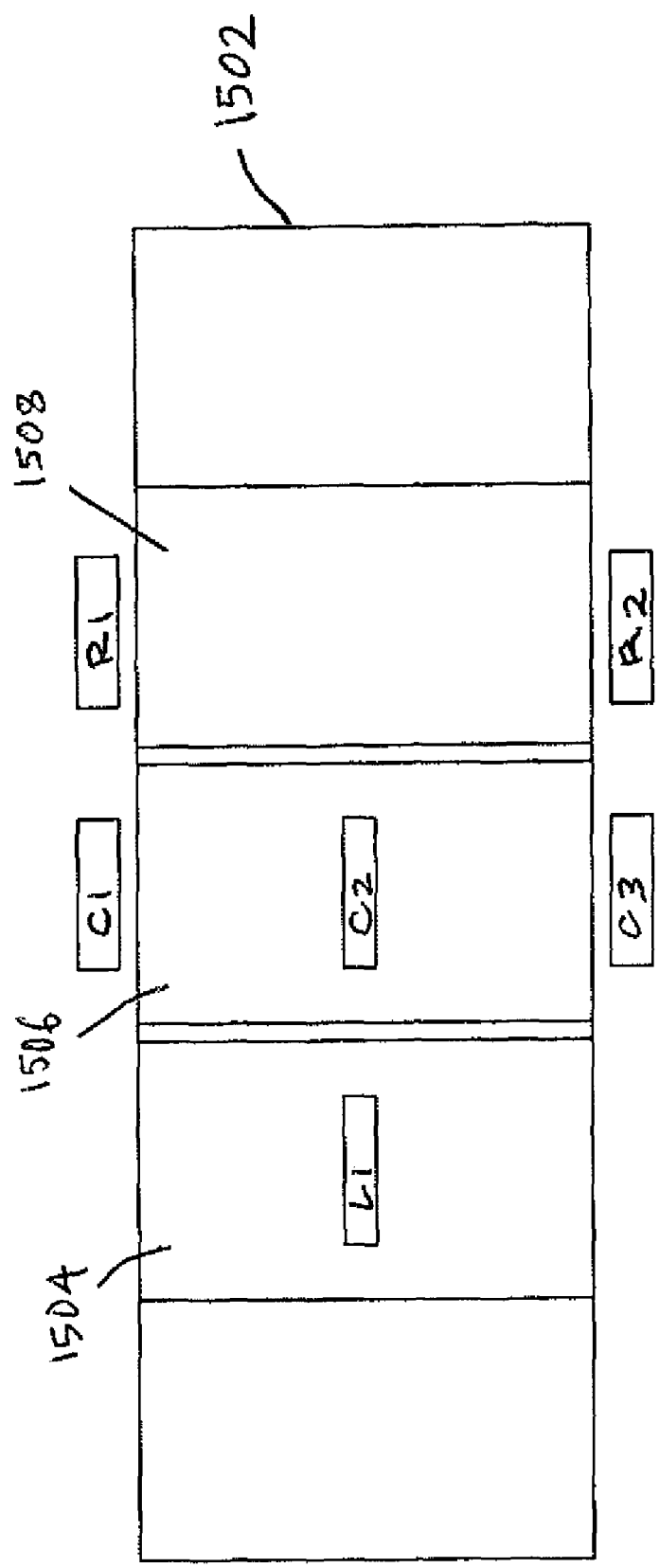
FIG. 15 is a schematic diagram of a shaft having three regions showing the placement of eight field sensors around the shaft (only six are visible) to improve rotation signal uniformity compared to using only four field sensors.

Similarly, FIG. 15 is a schematic diagram of a shaft 1502 having three regions 1504, 1506, 1508 showing the placement of four primary field sensors C1, C2, C3, C4 (not visible) around the center region 1506, two secondary field sensors R1, R2 around the right region 1508, and two secondary field sensors L1, L2 (not visible) around the left region 1504 of the shaft 1502 to improve the rotational signal uniformity of the magnetic field seen by the field sensors compared to using only four field sensors.

Figure 16:
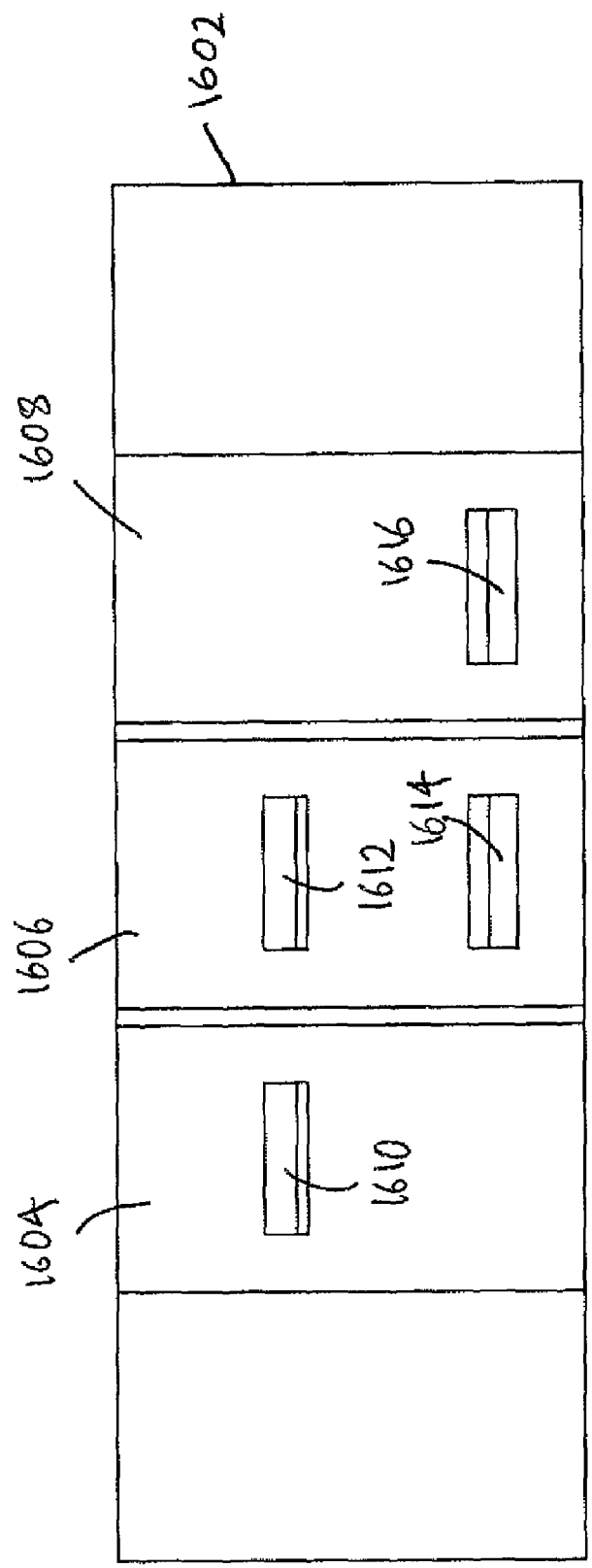
FIG. 16 is schematic diagram of a shaft having three regions showing the placement of field sensors with 45 degrees between field sensors in the circumferential direction.
Figure 17:
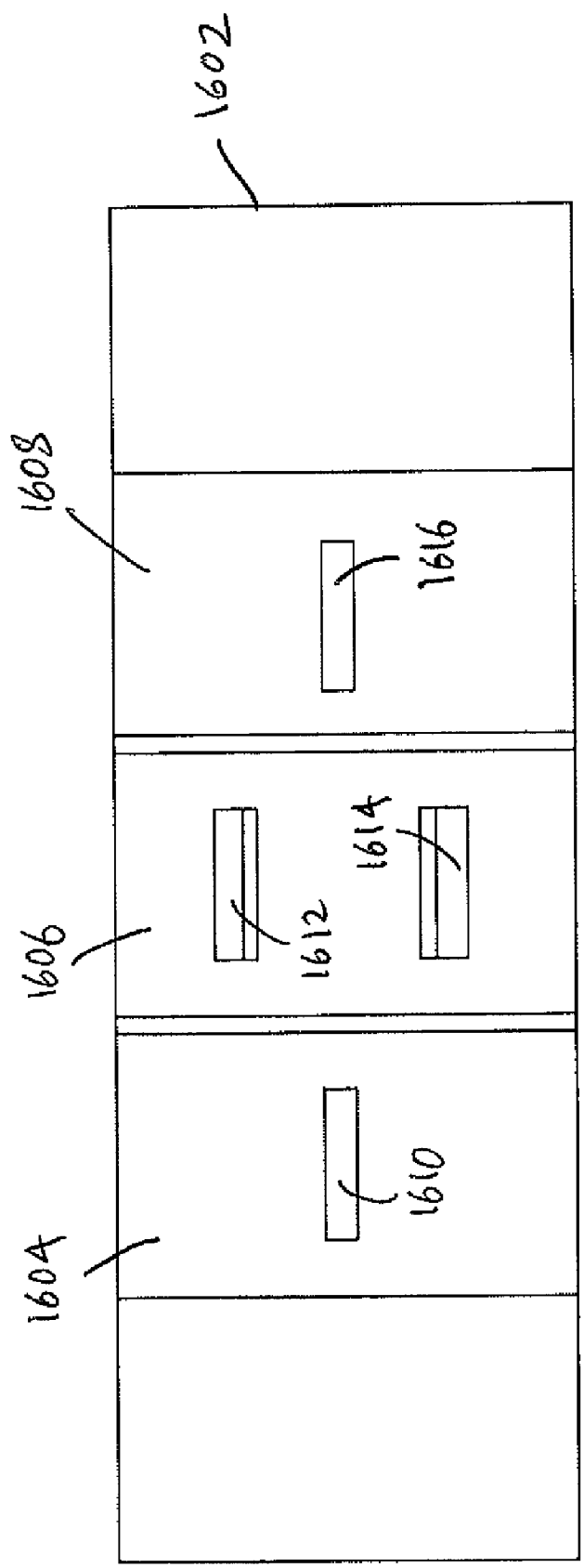
FIG. 17 is a schematic diagram of a shaft having three regions showing an alternative placement of field sensors with 45 degrees between field sensors in the circumferential direction.

FIG. 16 is schematic diagram of a shaft 1602 having three regions 1604, 1606, 1608 showing the placement of field sensors with 45 degrees between the field sensors 1610, 1612, 1614, 1616 in the circumferential direction. FIG. 17 is a schematic diagram of the shaft 1602 having the three regions 1604, 1606, 1608 showing an alternative placement of the field sensors 1610, 1612, 1614, 1616 with 45 degrees between field sensors in the circumferential direction. The field sensors 1610, 1612, 1614, 1616 are closely located along the circumferential direction so that the field sensors can avoid the magnetic near field at the opposite (rear) side of shaft (near source is not visible). This scheme also could enhance the rotational signal uniformity if the shaft 1602 needs to rotate a finite angle, not a full rotation. The field sensors 1610, 1612, 1614, 1616 can be placed only near a part of the shaft 1602 having a uniform field, and would not see the rotational signal from the part of the shaft 1602 having a non-uniform field. Such an embodiment might be desired if the shaft is not circumferentially symmetric such as would be the case if a flat or keyway section is present.

Because the torque-dependent fields emanating from each region have both a radial component and an axial component, other embodiments of the present invention could also be realized by the use of field sensors arranged and positioned to detect the radial components of the torque dependent field as well as the radially-directed magnetic fields of external origin.

Of course, the closer the near field interference source is to the sensing regions, the more non-linear the magnitude of the interfering field will be over the axial extent of the sensor locations, which may reduce the effectiveness of the field sensors in providing for the cancellation of noise due to near field sources.

In contrast, because the regions embodied in the '059 patent are immediately proximate, they more closely reflect that of a single point measurement, which is highly susceptible to error in the presence of a highly divergent "noise" field. Related to this is the fact that, if the interfering field originates at either end of the shaft, it will predominately affect the nearest of the two sensing regions, again causing an error inducing measurement bias. The size of magnetic regions can be varied for different applications. The number of field sensors can also be varied depending on different applications.

The present invention cancels out the near field effect more effectively than the prior art dual region, dual sensor array common mode rejection scheme as taught in the '059 patent, especially for near fields transferring through the axial direction of the shaft because the field sensors placed near each of the oppositely magnetized regions experience different magnitudes of the near field. The field sensor coils located closer to the near field source sense a higher magnitude of the near field than the field sensors located away from the near field source. A typical separation between the paired field sensors in the common mode rejection scheme is about 2 cm. As can be seen from FIG. 5, the difference in signal between two points 2 cm apart is very large, enough to significantly affect the true torque value being measured. Even using a shield device in a cylindrical tube shape surrounding the torque sensing shaft cannot attenuate near field transfer through the axial direction of the shaft.

The present invention, therefore, eliminates the effect of a strong near field transferring through the shaft by arrangement of the field sensors along the shaft so as to cancel out the near field signals. The primary field sensors at the center of the shaft or region are oppositely oriented with respect to the secondary field sensors on either side of the center field sensors. The distances from the right sensor coil and center sensor coil, and from the left sensor coil and center sensor coil, are preferably the same or approximately the same. A linear decrease of the near field along the axial direction of the shaft from the near field source results in the sensor array cancelling out the near field effect, as can be seen in Tables 1, 2 and 3.

Thus, an advantage of the present invention over the device of the '059 patent is its effective capability of handling various near field sources. In the '059 patent, there is no function to eliminate the near field effect such as near field transferring though a shaft, which is in contact to the near field source or located close to the near field source even with it being protected by a shielding device. One field sensor of the pair located closer to the near field source sees a larger magnetic near field level than the other field sensor, thus an unbalanced signal output between the paired field sensors is produced, significantly altering the true torque-induced signal.

An alternate embodiment of the present invention eliminates not only a near field scenario in which the magnitude decreases linearly from the near field source, but also the near field scenario in which the magnitude decreases nonlinearly from the near field source. The latter near field scenario can happen when the active regions of a shaft and corresponding sensor array is in close proximity to a ferromagnetic structure such as a flange, a bearing, or even a shaft section having a larger diameter, (ferromagnetic asymmetry) and either the right field sensors or the left field sensors are in the proximity of this ferromagnetic asymmetry. In this situation the interfering field manifests as a nonlinearly varying near field effect due to the close presence of a ferromagnetic asymmetry, which increases the near field effect to the field sensor located close to the asymmetric ferromagnetic structure.

In order to compensate for the nonlinear property of this type of interfering field, the right and left secondary sensors are located with a corresponding asymmetry of distances from the center primary sensor(s). For example, without the presence of a ferromagnetic asymmetry or the ferromagnetic asymmetry being located far enough away from field sensors for the interfering field to be substantially linear as shown in the curve of FIG. 1, the distance between the center sensor(s), and the respective right and left sensors are the same. But in this alternate embodiment where a ferromagnetic asymmetry is located in proximity to either the right or left sensor(s), the distance between the sensor located closest to the ferromagnetic asymmetry and the center sensor is reduced by some amount relative to the distance between the center primary sensor and the secondary sensor(s) located farthest from the ferromagnetic asymmetry. By biasing the distance of one outboard secondary sensor array from the center primary sensor array in relation to the other outboard secondary sensor array, their average output values are, in effect, weighted in such a manner as to provide a reasonable approximation of the magnitude of the interfering field seen by the center sensor(s). The optimal positions of the right sensor(s) and left sensor(s) can be determined by measuring and mapping the actual interfering field along the axial direction of a shaft and/or simulation via computer modeling to determine what the necessary biasing distances between the outboard and center sensors must be in order to provide a weighted average field measurement that yields an accurate approximation of what the interfering field strength is at the center sensor array location.

Figure 18:
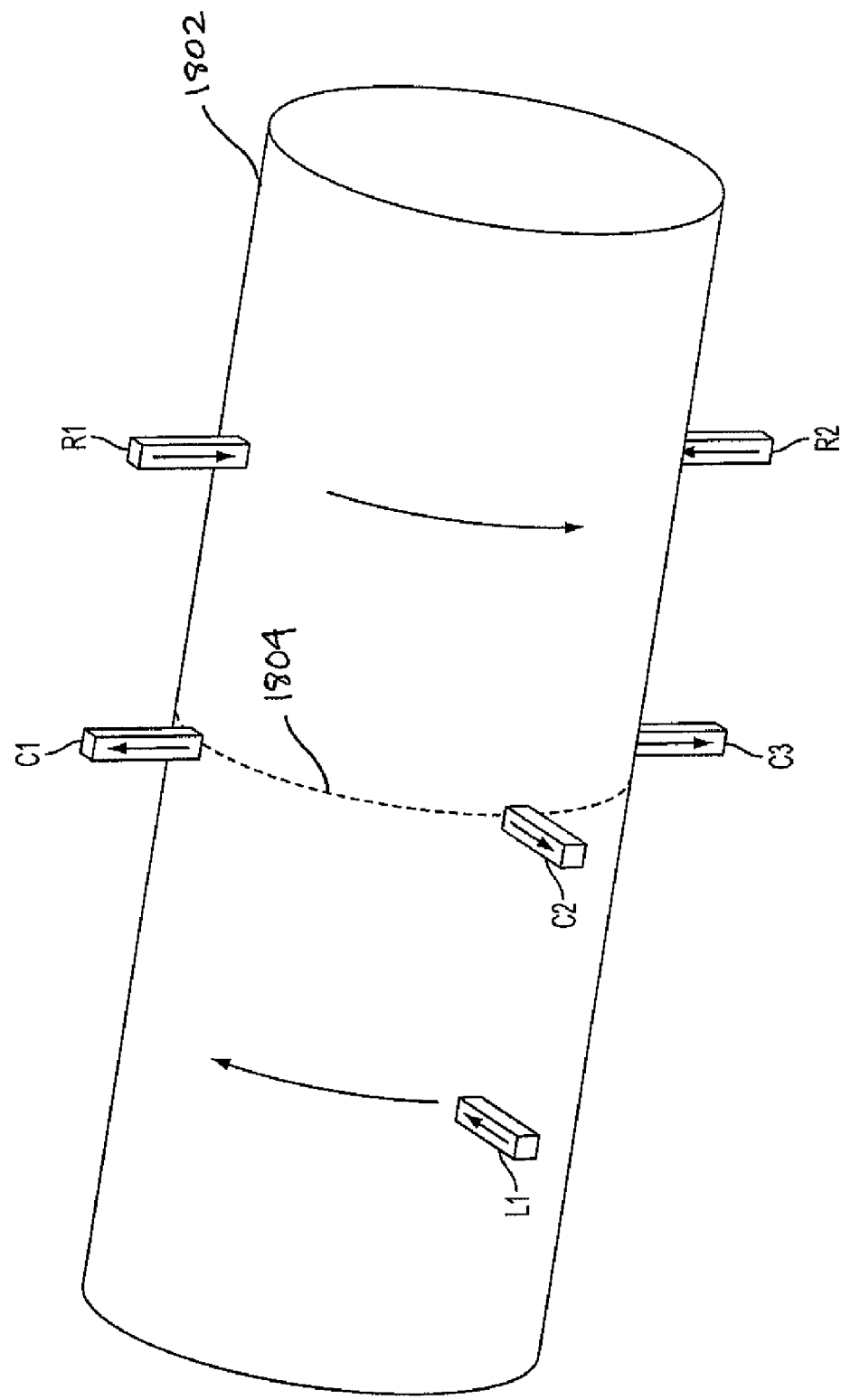
FIG. 18 is a perspective drawing of a shaft having two regions showing the placement of field sensors around the shaft.
Figure 19:
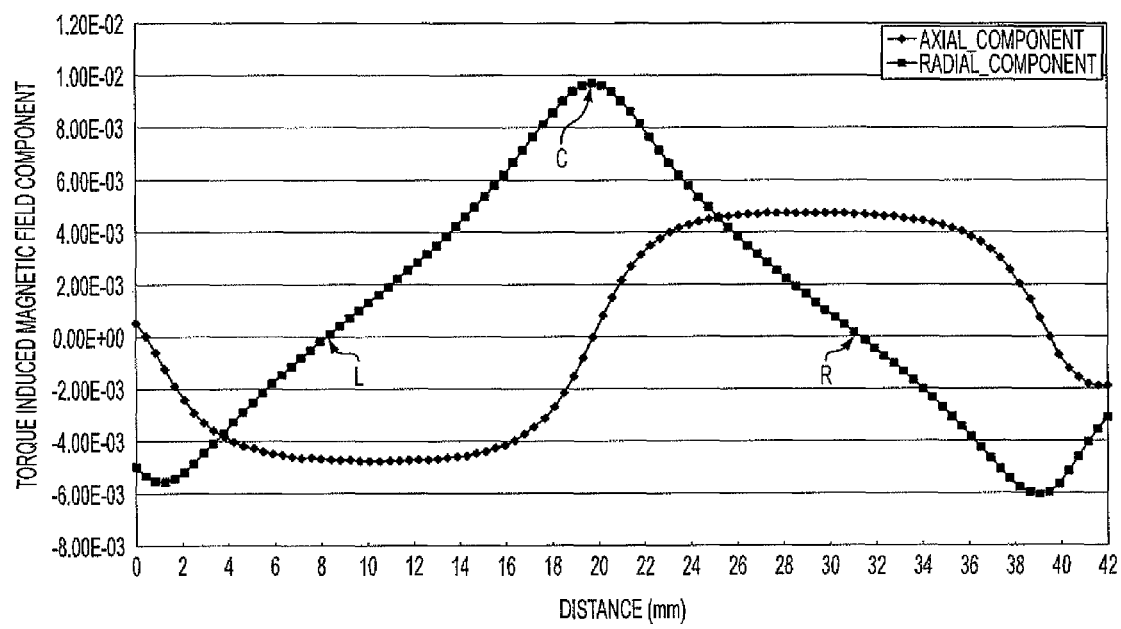
FIG. 19 is a graph showing the magnetic field mapping of the shaft of FIG. 18.

In each of the previous embodiments of the present invention, the sensors have been oriented in such a manner as to measure the axial component of the torque-dependent magnetic field. In other embodiments of the present invention, as depicted in FIG. 18, the axes of the secondary sensors R1 and R2, primary sensors C1, C2, C3, and C4 (not visible), and secondary sensors L1 and L2 (also not visible) can be oriented normal to the surface of the shaft 1802 such that they measure the radial component of the torque-dependent field which, owing to the shape of the flux path between the poles of the active region, is manifested by a higher magnetic flux density. Such an embodiment might be more suitable if, for example higher sensitivity is required, or the magnetic conditioned region is narrow in relation to the length of the individual magnetic field sensors. The radial magnetic field component measurement can be performed either by using the dual region magnetically conditioned region as taught in the prior art '059 patent with placement of coils in the middle of each of the oppositely polarized magnetic regions of the active region and at the boundary 1804 between the two oppositely polarized regions as shown in FIG. 18 FIG. 19 is a graph showing the magnetic field mapping of the shaft 1802 of FIG. 18, showing the axial and radial components of the magnetic field.

Although certain presently preferred embodiments of the disclosed invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by the appended claims and the applicable rules of law.

I claim:

1. A method for reducing the noise in a signal from a torque sensor caused by near magnetic field sources, the method comprising the steps of:
   providing a torque sensor comprising:
      a longitudinally extending member;
      a magnetoelastically active region directly or indirectly attached to/or forming a part of the surface of the member, the active region comprising at least one region magnetized in a first substantially circumferential direction in such a manner that torque applied to the member is proportionally transmitted to the active region;
      at least one primary magnetic field sensors arranged proximate the at least one region for outputting a first signal corresponding to a torque-dependent magnetic flux emanating from the active region;
      at least one secondary magnetic field sensor axially spaced in a first direction by a pre-determined first distance from the plurality of primary magnetic field sensors for outputting a second signal corresponding to an ambient magnetic flux emanating from the near magnetic field source;
      at least one secondary magnetic field sensor axially spaced in a second direction opposite the first direction a pre-determined second distance from the plurality of primary magnetic field sensors for outputting a third signal corresponding to the ambient magnetic flux emanating from the near magnetic field source;
   receiving the first signal upon the application of the torque;
   receiving the second and third signals; and
   adjusting the first signal using the second and third signals thereby compensating for the effects of the near magnetic field source.

2. The method of claim 1, wherein the magnetic field sensors are vector sensors.

3. The method of claim 1, wherein the vector sensors are one of a Hall effect, magnetoresistance, magnetotransistor, magnetodiode, or MAGFET field sensors.

4. The method of claim 1, wherein the member is a shaft incorporated in an on-road or off-road vehicle, a ship, or an industrial process.

5. The method of claim 1, wherein the pre-determined first and second distances are substantially the same.

6. The method of claim 1, wherein the magnitude of the magnetic field emanating from the near magnetic field source decreases linearly from the source in an axial direction of the member.

7. The method of claim 1, wherein the pre-determined first and second distances are different.

8. The method of claim 7, wherein the magnitude of the magnetic field emanating from the near magnetic field source decreases non-linearly from the source in an axial direction of the member.

9. The method of claim 7, wherein the predetermined first and second distances are such that an average of the second and third signals approximates the value of the ambient magnetic flux present at the location of the plurality of the primary magnetic field sensors.

10. The method of claim 1, wherein the torque sensor comprises two primary magnetic field sensors; one secondary magnetic field sensor axially spaced in the first direction; and one secondary magnetic field sensor axially spaced in the second, opposite direction.

11. The method of claim 10, wherein one of the primary magnetic field sensors and one of the secondary magnetic field sensors are arranged on one side of the member, and wherein the other of the primary magnetic field sensors and the other of the secondary magnetic field sensors are arranged on an opposite side of the member.

12. The method of claim 10, wherein all four of the field sensors are arranged substantially on one side of the member and approximately opposite the near magnetic field source on the opposite side of the member.

13. The method of claim 1, wherein the torque sensor comprises four primary magnetic field sensors; two secondary magnetic field sensors axially spaced in the first direction; and two secondary magnetic field sensors axially spaced in the second, opposite direction.

14. The method of claim 1, wherein the active region comprises two axially-spaced regions, the first being magnetized in a first substantially circumferential direction and the other being magnetized in a second substantially circumferential direction opposite the first direction in such a manner that the torque applied to the member is proportionally transmitted to the active region, and wherein the at least one secondary magnetic field sensors axially spaced in the first direction is proximate one of the regions, and wherein the at least one secondary magnetic field sensors axially spaced in the second, opposite direction is proximate the other region.

15. The method of claim 14, wherein the torque sensor comprises two primary magnetic field sensors; one secondary magnetic field sensor axially spaced in the first direction; and one secondary magnetic field sensor axially spaced in the second, opposite direction.

16. The method of claim 15, wherein one of the primary magnetic field sensors and one of the secondary magnetic field sensors are arranged on one side of the member, and wherein the other of the primary magnetic field sensors and the other of the secondary magnetic field sensors are arranged on an opposite side of the member.

17. The method of claim 14, wherein the torque sensor comprises four primary magnetic field sensors; two secondary magnetic field sensor axially spaced in the first direction; and two secondary magnetic field sensor axially spaced in the second, opposite direction.

18. The method of claim 14, wherein the primary and secondary magnetic field sensors are oriented substantially normally to the surface of the member.

19. The method of claim 1, wherein the active region comprises three axially-spaced regions, the middle region being magnetized in a first substantially circumferential direction and the outer regions being magnetized in a second substantially circumferential direction opposite the first direction in such a manner that the torque applied to the member is proportionally transmitted to the active region, and wherein the at least one secondary magnetic field sensors axially spaced in the first direction is proximate one of the outer regions, and wherein the at least one secondary magnetic field sensor axially spaced in the second, opposite direction is proximate the other outer region.

20. The method of claim 19, wherein the torque sensor comprises two primary magnetic field sensors; one secondary magnetic field sensor axially spaced in the first direction; and one secondary magnetic field sensor axially spaced in the second, opposite direction.

21. The method of claim 20, wherein one of the primary magnetic field sensors and one of the secondary magnetic field sensors are arranged on one side of the member, and wherein the other of the primary magnetic field sensors and the other of the secondary magnetic field sensors are arranged on an opposite side of the member.

22. The method of claim 19, wherein the torque sensor comprises four primary magnetic field sensors; two secondary magnetic field sensor axially spaced in the first direction; and two secondary magnetic field sensor axially spaced in the second, opposite direction.

23. The method of claim 22, wherein all four of the field sensors are substantially on one side of the member and approximately opposite the near or far field source on the opposite side of the member.

24. The method of claim 19, wherein the primary and secondary magnetic field sensors are oriented substantially normally to the surface of the member.

25. The method of claim 24, wherein the primary and secondary magnetic field sensors are oriented substantially normally to the surface of the member at the respective boundaries between the regions.

26. A torque sensor comprising:
a longitudinally extending member;
a magnetoelastically active region directly or indirectly attached to/or forming a part of the surface of the member, the active region comprising at least one region magnetized in a first substantially circumferential direction in such a manner that torque applied to the member is proportionally transmitted to the active region;
a plurality of primary magnetic field sensors arranged proximate the at least one region for outputting a first signal corresponding to a torque-dependent magnetic flux emanating from the active region;
at least one secondary magnetic field sensor axially spaced in a first direction by a pre-determined first distance from the plurality of primary magnetic field sensors for outputting a second signal corresponding to an ambient magnetic flux emanating from a near magnetic field source;
at least one secondary magnetic field sensor axially spaced in a second direction opposite the first direction by a pre-determined second distance from the plurality of primary magnetic field sensors for outputting a third signal corresponding to the ambient magnetic flux emanating from the near magnetic field source;
means for adjusting the first signal using the second and third signals thereby compensating for the effects of the near magnetic field source.

27. The torque sensor of claim 26, wherein the magnetic field sensors are vector sensors.

28. The torque sensor of claim 27, wherein the vector sensors are one of a Hall effect, magnetoresistance, magnetotransistor, magnetodiode, or MAGFET field sensors.

29. The torque sensor of claim 26, wherein the member is a shaft incorporated in an on-road or off-road vehicle, a ship, or an industrial process.

30. The torque sensor of claim 26, wherein the pre-determined first and second distances are substantially the same.

31. The torque sensor of claim 26, wherein the magnitude of the magnetic field emanating from the near magnetic field source decreases linearly from the source in an axial direction of the member.

32. The torque sensor of claim 26, wherein the magnitude of the magnetic field emanating from the near magnetic field source decreases non-linearly from the source in an axial direction of the member.

33. The torque sensor of claim 32, wherein the pre-determined first and second distances are such that an average of the second and third signals approximates the value of the ambient magnetic flux present at the location of the plurality of the primary magnetic field sensors.

34. The torque sensor of claim 26, where the pre-determined first and second distances are different.

35. The torque sensor of claim 26, wherein the torque sensor comprises two primary magnetic field sensors; one secondary magnetic field sensor axially spaced in the first direction; and one secondary magnetic field sensor axially spaced in the second, opposite direction.

36. The torque sensor of claim 35, wherein one of the primary magnetic field sensors and one of the secondary magnetic field sensors are arranged on one side of the member, and wherein the other of the primary magnetic field sensors and the other of the secondary magnetic field sensors are arranged on an opposite side of the member.

37. The torque sensor of claim 35, wherein all four of the field sensors are arranged substantially on one side of the member and approximately opposite the near magnetic field source on the opposite side of the member.

38. The torque sensor of claim 26, wherein the torque sensor comprises four primary magnetic field sensors; two secondary magnetic field sensors axially spaced in the first direction; and two secondary magnetic field sensors axially spaced in the second, opposite direction.

39. The torque sensor of claim 26, wherein the active region comprises two axially-spaced regions, the first being magnetized in a first substantially circumferential direction and the other being magnetized in a second substantially circumferential direction opposite the first direction in such a manner that the torque applied to the member is proportionally transmitted to the active region, and
wherein the at least one secondary magnetic field sensors axially spaced in the first direction is proximate one of the regions, and
wherein the at least one secondary magnetic field sensor axially spaced in the second, opposite direction is proximate the other region.

40. The torque sensor of claim 39, wherein the torque sensor comprises two primary magnetic field sensors; one secondary magnetic field sensor axially spaced in the first direction; and one secondary magnetic field sensor axially spaced in the second, opposite direction.

41. The torque sensor of claim 40, wherein one of the primary magnetic field sensors and one of the secondary magnetic field sensors are arranged on one side of the member, and wherein the other of the primary magnetic field sensors and the other of the secondary magnetic field sensors are arranged on an opposite side of the member.

42. The torque sensor of claim 40, wherein the active region comprises three axially-spaced regions, the middle region being magnetized in a first substantially circumferential direction and the outer regions being magnetized in a second substantially circumferential direction opposite the first direction in such a manner that the torque applied to the member is proportionally transmitted to the active region, and
wherein the at least one secondary magnetic field sensors axially spaced in the first direction is proximate one of the outer regions, and
wherein the at least one secondary magnetic field sensors axially spaced in the second, opposite direction is proximate the other outer region.

43. The torque sensor of claim 39, wherein the torque sensor comprises four primary magnetic field sensors; two secondary magnetic field sensors axially spaced in the first direction; and two secondary magnetic field sensors axially spaced in the second, opposite direction.

44. The torque sensor of claim 39, wherein the primary and secondary magnetic field sensors are oriented substantially normally to the surface of the member.

45. The torque sensor of claim 39, wherein the torque sensor comprises two primary magnetic field sensors; one secondary magnetic field sensor axially spaced in the first direction; and one secondary magnetic field sensor axially spaced in the second, opposite direction.

46. The torque sensor of claim 45, wherein one of the primary magnetic field sensors and one of the secondary magnetic field sensors are arranged on one side of the member, and wherein the other of the primary magnetic field sensors and the other of the secondary magnetic field sensors are arranged on an opposite side of the member.

47. The torque sensor of claim 39, wherein the torque sensor comprises four primary magnetic field sensors; two secondary magnetic field sensors axially spaced in the first direction; and two secondary magnetic field sensors axially spaced in the second, opposite direction.

48. The torque sensor of claim 47, wherein all four of the field sensors are substantially on one side of the member and approximately opposite the near or far field source on the opposite side of the member.

49. The torque sensor of claim 39, wherein the primary and secondary magnetic field sensors are oriented substantially normally to the surface of the member.

50. The torque sensor of claim 39, wherein the primary and secondary magnetic field sensors are oriented substantially normally to the surface of the member at the respective boundaries between the regions.

\* \* \* \* \*